(12) United States Patent
Dome et al.

(10) Patent No.: US 12,068,043 B2
(45) Date of Patent: Aug. 20, 2024

(54) SEMICONDUCTOR MEMORY DEVICE

(71) Applicant: Kioxia Corporation, Tokyo (JP)

(72) Inventors: Masato Dome, Yokohama Kanagawa (JP); Kensuke Yamamoto, Yokohama Kanagawa (JP); Masaru Koyanagi, Tokyo (JP); Ryo Fukuda, Yokohama Kanagawa (JP); Junya Matsuno, Yokohama Kanagawa (JP); Kenro Kubota, Fujisawa Kanagawa (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/959,098

(22) Filed: Oct. 3, 2022

(65) Prior Publication Data

US 2023/0028971 A1 Jan. 26, 2023

Related U.S. Application Data

(63) Continuation of application No. 17/202,590, filed on Mar. 16, 2021, now Pat. No. 11,495,307.

(30) Foreign Application Priority Data

Sep. 18, 2020 (JP) .................. 2020-157800

(51) Int. Cl.
*G11C 16/30* (2006.01)
*G11C 16/04* (2006.01)

(52) U.S. Cl.
CPC .......... *G11C 16/30* (2013.01); *G11C 16/0483* (2013.01)

(58) Field of Classification Search
CPC .......................... G11C 16/30; G11C 16/0483
USPC ..................................... 365/185.16
See application file for complete search history.

(56) References Cited

U.S. PATENT DOCUMENTS

| | | | |
|---|---|---|---|
| 9,520,164 B1 | 12/2016 | Yamamoto et al. | |
| 10,360,982 B2 | 7/2019 | Suematsu et al. | |
| 10,790,266 B2 | 9/2020 | Ito et al. | |
| 10,916,276 B2 | 2/2021 | Yamamoto et al. | |
| 11,277,134 B2 | 3/2022 | Matsuno et al. | |
| 11,380,406 B2 | 7/2022 | Hagiwara et al. | |
| 11,495,307 B2* | 11/2022 | Dome ................ | G11C 29/028 |
| 2008/0159034 A1 | 7/2008 | Tsukada | |
| 2015/0310907 A1 | 10/2015 | Yamagami | |
| 2022/0093188 A1 | 3/2022 | Matsuno et al. | |

FOREIGN PATENT DOCUMENTS

WO 2018055734 A1 3/2018

* cited by examiner

*Primary Examiner* — Huan Hoang
(74) *Attorney, Agent, or Firm* — Holtz, Holtz & Volek PC

(57) ABSTRACT

According to one embodiment, a semiconductor memory device includes: first and second circuit units, a driver circuit, an input/output pad, first and second power supply pads, and first and second interconnects. The first interconnect is configured to provide coupling between the first circuit unit and the first power supply pad. The second interconnect is configured to provide coupling between the second circuit unit and the first power supply pad and have no electrical coupling to the first interconnect.

12 Claims, 17 Drawing Sheets

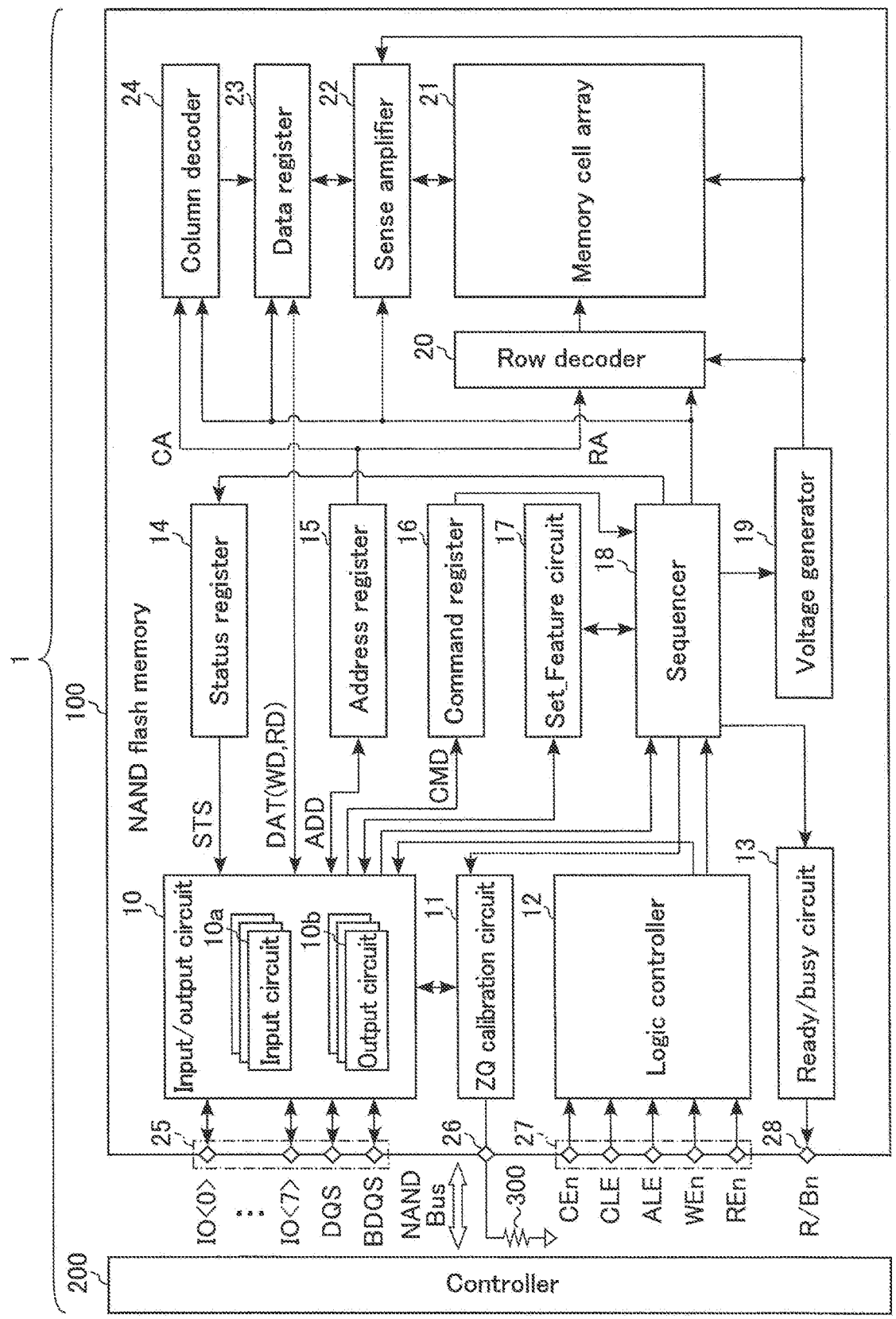
F I G. 1

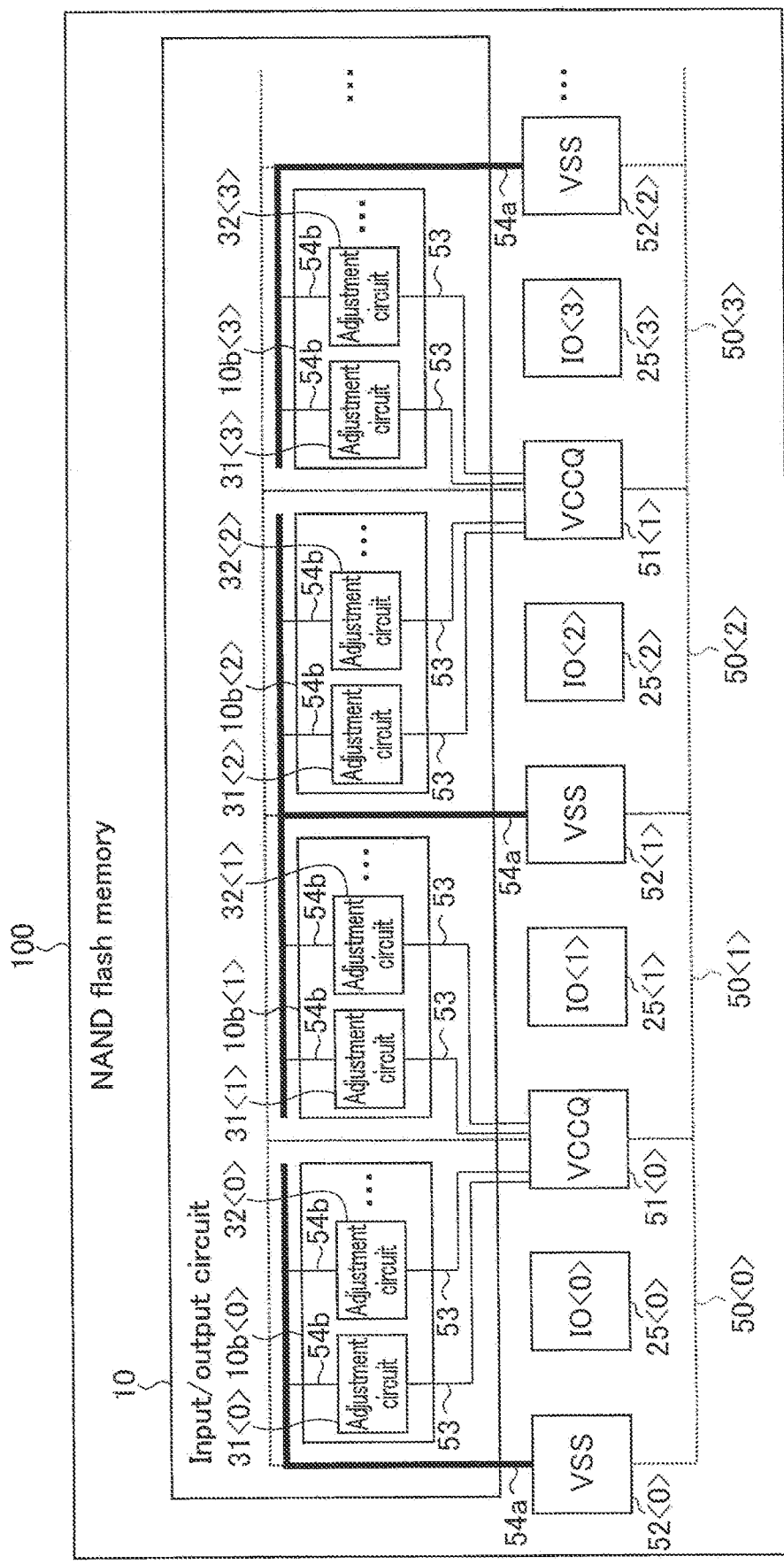
F I G. 3

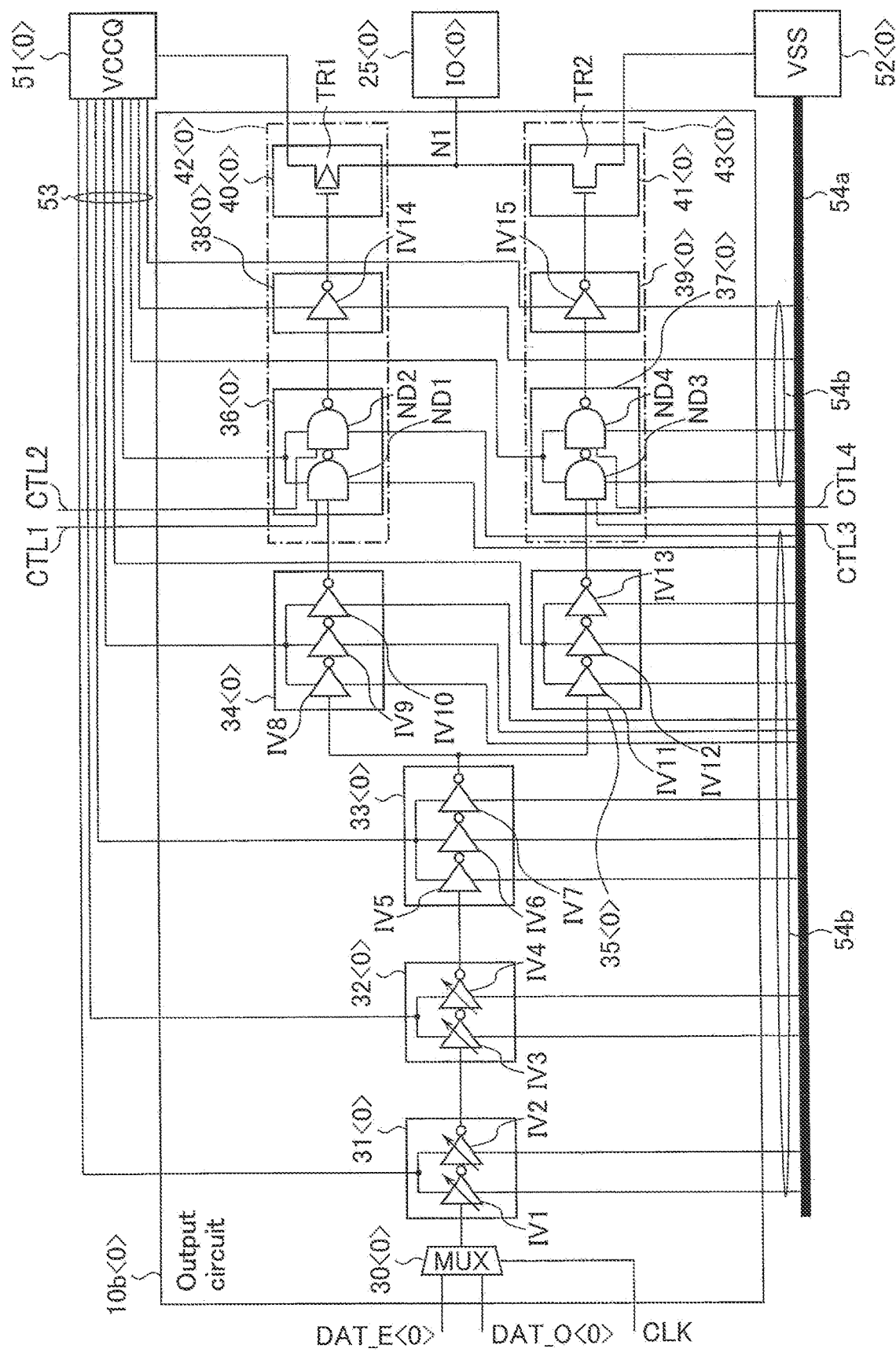
F I G. 4

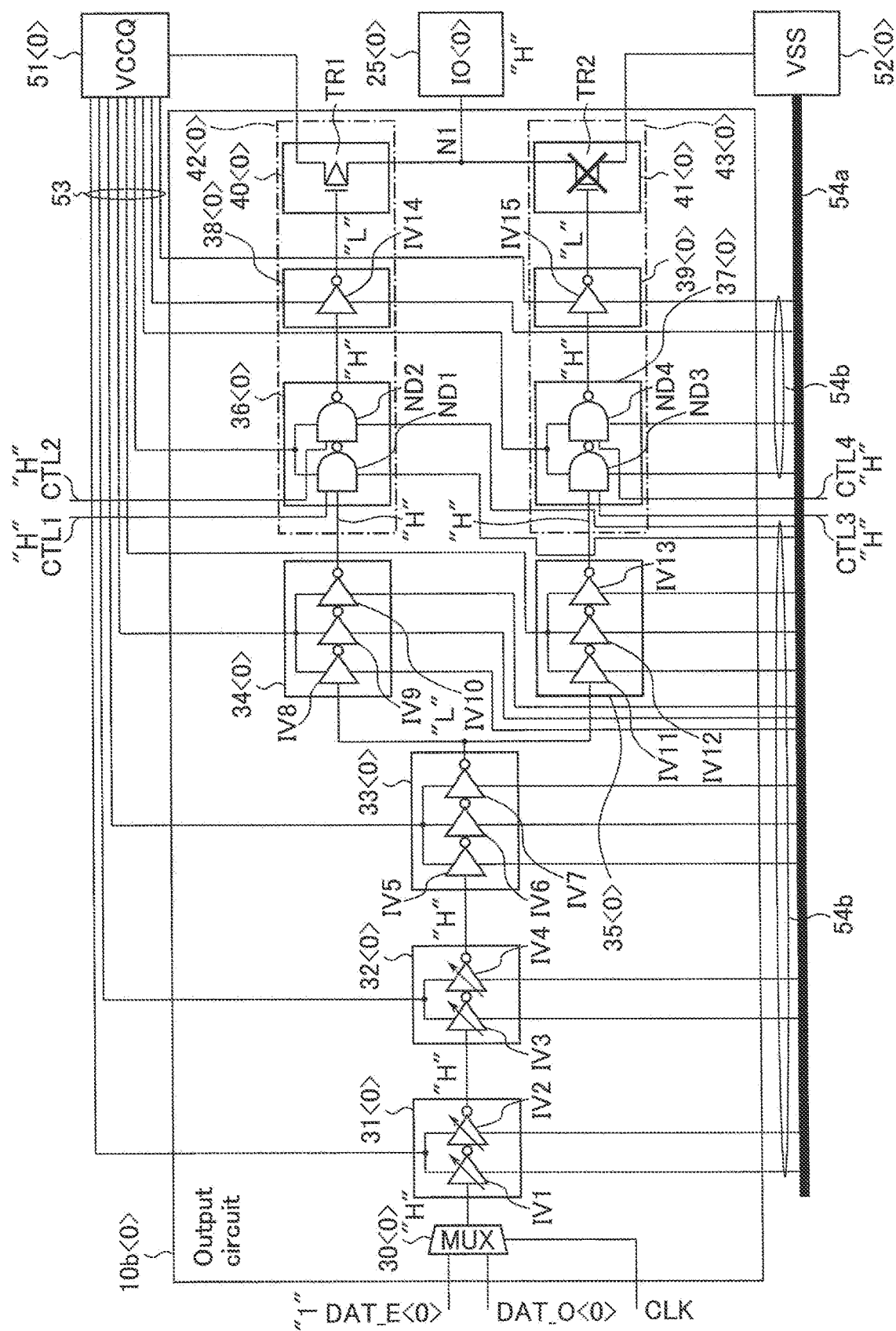
F I G. 6

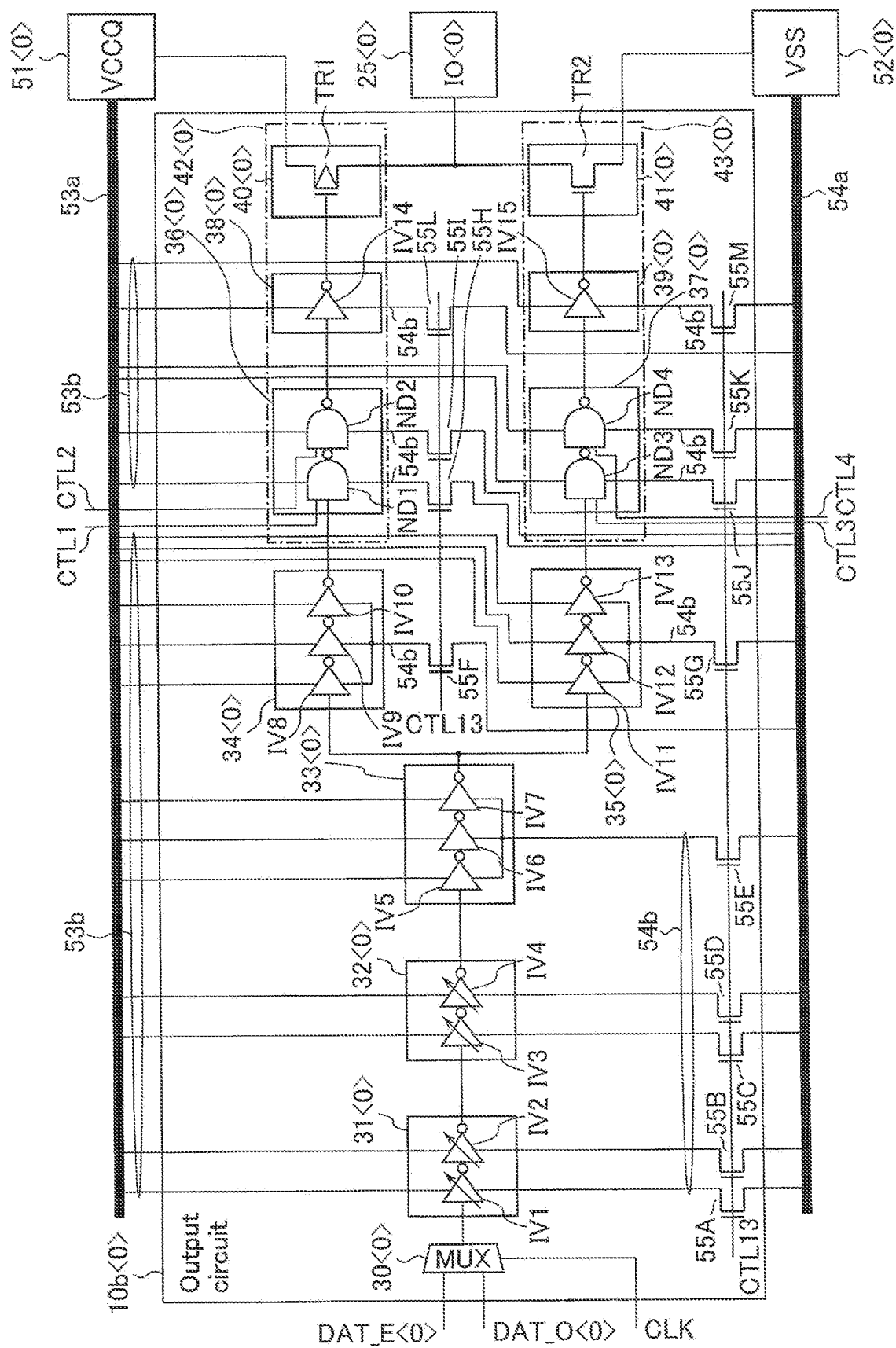
F I G. 13

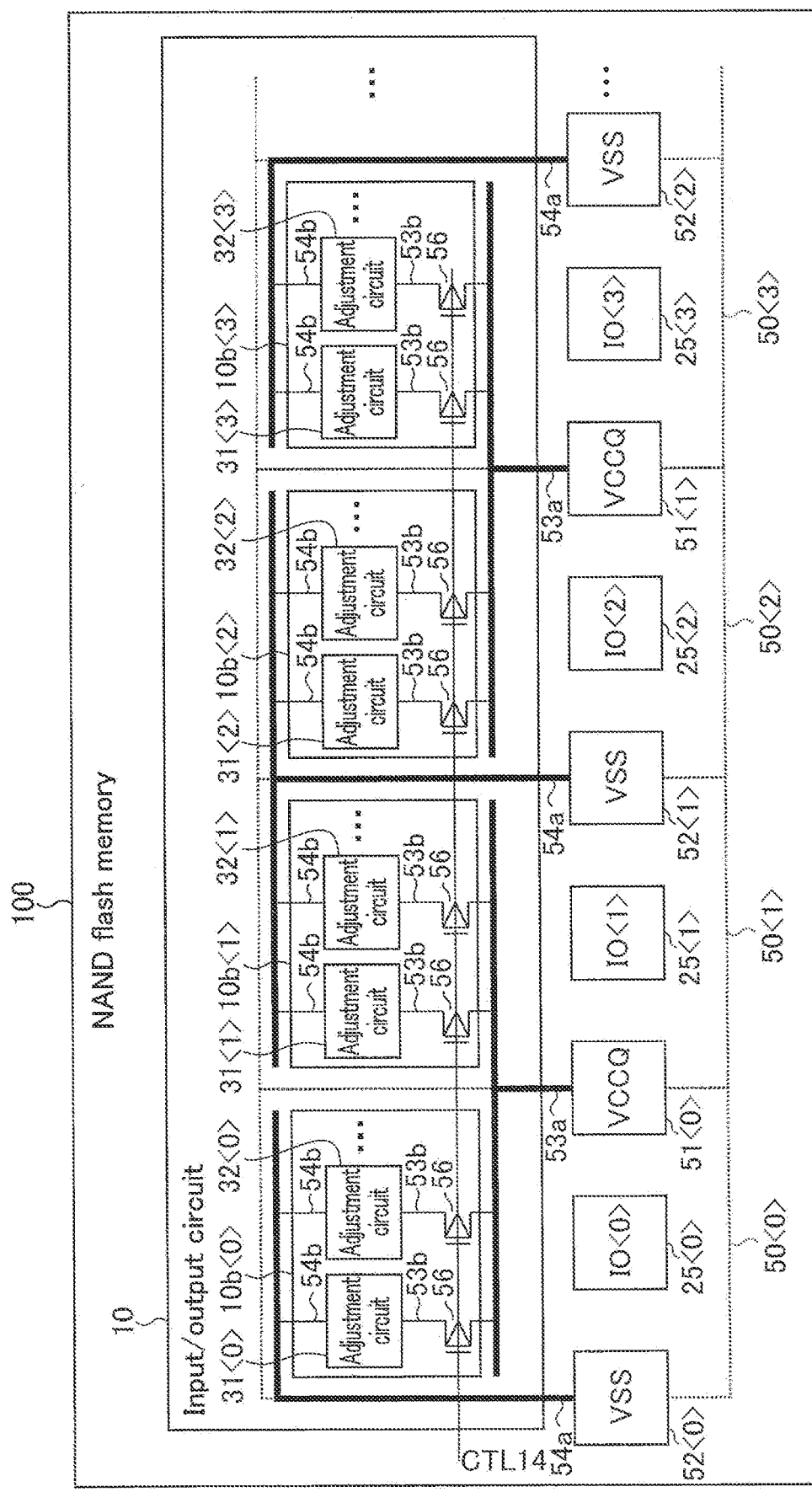
F I G. 14

SEMICONDUCTOR MEMORY DEVICE

CROSS-REFERENCE TO RELATED APPLICATIONS

This application is a Continuation application of U.S. application Ser. No. 17/202,590, filed Mar. 16, 2021, which is based upon and claims the benefit of priority from prior Japanese Patent Application No. 2020-157800, filed Sep. 18, 2020, the entire contents of both of which are incorporated herein by reference.

FIELD

Embodiments described herein relate generally to a semiconductor memory device.

BACKGROUND

As a semiconductor memory device, NAND flash memories are known.

BRIEF DESCRIPTION OF THE DRAWINGS

FIG. 1 is a block diagram of a memory system including a semiconductor memory device according to a first embodiment.

FIG. 3 is a block diagram of the input/output circuit included in the semiconductor memory device according to the first embodiment.

FIG. 4 is a circuit diagram showing one example of an output circuit included in the semiconductor memory device according to the first embodiment.

FIG. 6 is a diagram illustrating an operation of the output circuit included in the semiconductor memory device according to the first embodiment.

FIG. 13 is a circuit diagram showing one example of an output circuit included in the semiconductor memory device according to the fourth embodiment.

FIG. 14 is a block diagram of an input/output circuit included in a semiconductor memory device according to a fifth embodiment.

DETAILED DESCRIPTION

Figure 2:
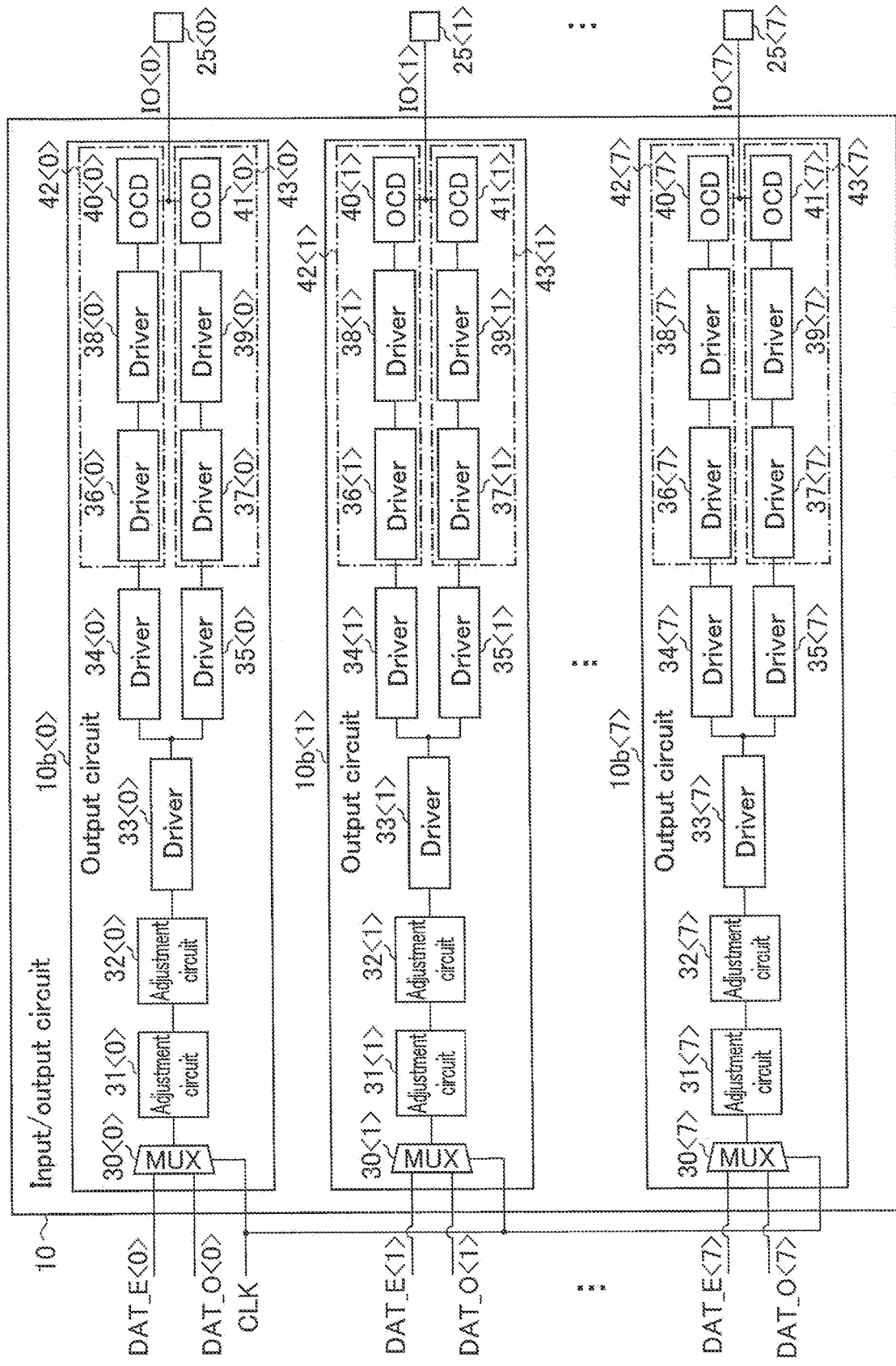
FIG. 2 is a block diagram of an input/output circuit included in the semiconductor memory device according to the first embodiment.

In general, according to one embodiment, a semiconductor memory device includes: a first circuit unit to which a first voltage and a second voltage different from the first voltage are applied, and which is configured to receive a first signal, and output a second signal predicated on the first signal; a second circuit unit to which the first voltage and the second voltage are applied, and which is configured to receive the second signal, and output a third signal predicated on the second signal; a driver circuit configured to receive a fourth signal predicated on the third signal and output a fifth signal predicated on the fourth signal; an input/output pad configured to externally output the fifth signal; a first power supply pad to which the first voltage is supplied from the outside; a second power supply pad to which the second voltage is supplied from the outside; a first interconnect configured to provide coupling between the first circuit unit and the first power supply pad; and a second interconnect configured to provide coupling between the second circuit unit and the first power supply pad and have no electrical coupling to the first interconnect.

Hereinafter, embodiments will be described with reference to the drawings. In the description, common parts are assigned common reference numerals throughout the drawings.

In the following description, a signal X<m:0> (where M is a natural number) is a signal of (m+1) bits and indicates a set of signals X<0>, X<1>, . . . , and X<m>, each of which is a 1-bit signal. In the signal X<m:0>, that is, in a digital signal of (m+1) bits, X<m> will be referred to as the most significant bit, and X(0) will be referred to as the least significant bit. A structural element Y<m:0> indicates a set of structural elements Y<0>, Y<1>, . . . , Y<m>, each of which corresponds one to one to input or output of the signal X<m:0>

1. First Embodiment

A semiconductor memory device according to a first embodiment will be described. By way of example, the following description will assume a semiconductor memory device to be a NAND flash memory.

1.1 Configuration 1.1.1 Overall Configuration of Memory System

First, an overall configuration of a memory system including a NAND flash memory according to the present embodiment will be described with reference to FIG. 1. FIG. 1 is a block diagram of the memory system including the NAND flash memory according to the present embodiment.

As shown in FIG. 1, a memory system 1 includes a NAND flash memory 100 and a controller 200. The NAND flash memory 100 and the controller 200 may form one semiconductor device in combination, for example. The semiconductor device is, for example, a memory card such as an SD™ card, a solid state drive (SSD), etc.

The NAND flash memory 100 includes a plurality of memory cell transistors, and stores data in a nonvolatile manner. A plurality of NAND flash memories 100 may be provided inside the memory system 1. In such a case, each of the NAND flash memories 100 is independently operable under the control of the controller 200.

The controller 200 is coupled to the NAND flash memory 100 via a NAND bus and controls the NAND flash memory 100. The NAND bus receives and transmits signals compatible with a NAND interface. Specific examples of this signal include a chip enable signal CEn, a command latch enable signal CLE, an address latch enable signal ALE, a write enable signal WEn, a read enable signal REn, a ready/busy signal R/Bn, an input/output signal IO, and a data strobe signal DQS and a data strobe signal BDQS (an inversion signal of the signal DQS).

The chip enable signal CEn is a signal for enabling the NAND flash memory 100, and is asserted at, for example, a low level ("L" level). The term "assert" means that a signal (or logic) is in a valid (active) state. The opposite term "negate" means that a signal (or logic) is in an invalid (inactive) state. The command latch enable signal CLE is a signal indicating that the signal IO is a command, and is asserted at, for example, a high level ("H" level). The address latch enable signal ALE is a signal indicating that the signal IO is an address, and is asserted at, for example, the "H" level. The write enable signal WEn is a signal for fetching a received signal into the NAND flash memory 100, and is asserted at, for example, the "L" level. Every time the write enable signal WEn is toggled, the NAND flash memory 100 fetches the signal IO. The read enable signal REn is a signal for the controller 200 to read data from the NAND flash memory 100. Every time the read enable signal REn is toggled, the NAND flash memory 100 outputs the signal IO to the controller 200.

The ready/busy signal R/Bn is a signal indicating whether the NAND flash memory 100 is in a busy state or in a ready state (whether or not a command can be received from the controller 200). For example, the ready/busy signal R/Bn is set to the "L" level when the NAND flash memory 100 is in the busy state.

Examples of the input/output signal IO include eight-bit signals IO<0> to IO<7> (hereinafter, these eight signals IO will be respectively referred to as signals IO<0> to IO<7> when they are distinguished from each other, and will be simply referred to as a signal IO or a signal IO<7:0> when they are not distinguished from each other). The input/output signal IO is an entity of data transmitted and received between the NAND flash memory 100 and the controller 200. Examples of input/output signal IO include a command, an address, write data, and read data. The data strobe signals DQS and BDQS are used to control timing of transmitting and receiving the signal IO, for example. For example, when data is written, the signals DQS and BDQS along with the write data IO are transmitted from the controller 200 to the NAND flash memory 100. The signals DQS and BDQS are then toggled, and the NAND flash memory 100 receives the write data IO, in synchronization with the signals DQS and BDQS. When data is read, the signals DQS and BDQS along with the read data IO are transmitted from the NAND flash memory 100 to the controller 200. The signals DQS and BDQS are generated based on the aforementioned read enable signal REn. The signals DQS and BDQS are then toggled, and the controller 200 receives the read data IO, in synchronization with the signals DQS and BDQS.

The controller 200 is coupled to a host device (not shown) via a host bus (not shown). The controller 200 accesses the NAND flash memory 100, for example, in accordance with an order received from the host device. The host device is, for example, a digital camera, a personal computer, etc. The host bus is, for example, an SD™ interface-compatible bus.

1.1.2 Configuration of NAND Flash Memory 100

The configuration of the NAND flash memory 100 according to the present embodiment will be described in detail by continuously referring to FIG. 1. In FIG. 1, some of the couplings between the blocks are indicated by arrows; however, the couplings between the blocks are not limited to those shown in FIG. 1.

As illustrated in FIG. 1, the NAND flash memory 100 includes an input/output circuit 10, a ZQ calibration circuit 11, a logic controller 12, a ready/busy circuit 13, a status register 14, an address register 15, a command register 16, a Set_Feature circuit 17, a sequencer 18, a voltage generator 19, a row decoder 20, a memory cell array 21, a sense amplifier 22, a data register 23, a column decoder 24, an input/output pad group 25, a ZQ pad 26, an input pad group 27, and an RB pad 28.

The input/output circuit 10 transmits and receives the signal IO<7:0>, the signal DQS, and the signal BDQS to and from the controller 200. The input/output circuit 10 may receive the signals DQS and BDQS from the controller 200 via the logic controller 12. The input/output circuit 10 transmits a command CMD within the signals IO<7:0> to the command register 16. The input/output circuit 10 transmits and receives an address ADD within the signals IO<7:0> to and from the address register 15, and transmits and receives data DAT within the signals IO<7:0> to and from the data register 23. The input/output circuit 10 transmits, to the Set_Feature circuit 17, a parameter setting for each of the various operations received from the controller 200, and receives, from the Set_Feature circuit 17, parameter information (hereinafter, referred to as "Ron set value information") concerning a set value for an output impedance (for example, a setting value of 25 Ω, 35Ω, or 50Ω).

The input/output circuit 10 includes a plurality of input circuits 10a and a plurality of output circuits 10b, which correspond to a plurality of signals. For example, a pair of a single input circuit 10a and a single output circuit 10b is coupled to a single pad within the input/output pad group 25, and is used to transmit and receive one bit of the signal IO<7:0>, the signal DQS, or the signal BDQS. Hereinafter, an input circuit 10a and an output circuit 10b which correspond to the signal IO<k> (where k is an integer equal to or greater than 0 and equal to or less than 7) will be referred to as an input circuit 10a<k> and an output circuit 10b<k>. The output circuit 10b will be described later in detail.

The input/output pad group 25 includes an IO pad 25<7:0>, a DQS pad 25_DQS, and a BDQS pad 25_BDQS respectively corresponding to the signal IO<7:0>, the signal DQS, and the signal BDQS. The input/output pad group 25 provides coupling between the input/output circuit 10 and the NAND bus. Each of the pads within the input/output pad group 25 may be recognized as a single output terminal having a certain output impedance when viewed from an outside of the NAND flash memory 100.

The ZQ calibration circuit 11 is coupled to a reference resistance element 300 with the ZQ pad 26 intervening therebetween. The ZQ calibration circuit 11 has a function of executing, according to instructions from the sequencer 18, a ZQ calibration operation for calibrating an output impedance of the NAND flash memory 100 based on the reference resistance element 300. For example, the ZQ calibration circuit 11 measures output impedances at the upper limit temperature and the lower limit temperature of operating environmental temperature of the NAND flash memory 100, thereby calculating a calibration value for a transistor size of an off-chip driver (OCD) to be described later within each output circuit 10b. In the following description, transistors that are different in transistor size indicate transistors that are, for example, different in gate width and are the same in the other parameters, such as gate length, gate oxide film thickness, and conditions for diffusion layers of a source and a drain. The calibration of transistor size indicates changing one or a combination of transistors to be selected from a plurality of transistors coupled in parallel, thereby calibrating a combined on-resistance Ron of the selected transistor or transistors. The ZQ calibration circuit 11 transmits, to the output circuit 10b, a Ron control signal for controlling the on-resistance Ron of the transistor of the OCD, based on a calibration result, Ron set value information, and Ron information to be described later.

The ZQ pad 26 has the first end coupled to the reference resistance element 300 and the second end coupled to the ZQ calibration circuit 11. The ZQ pad 26 may be recognized as a single output terminal having a certain output impedance when viewed from an outside of the NAND flash memory 100.

The logic controller 12 is coupled to the input pad group 27. The logic controller 12 receives signals CEn, CLE, ALE, WEn, and REn from the controller 200 via the input pad group 27. The logic controller 12 controls the input/output circuit 10 and the sequencer 18 in accordance with the received signal.

The input pad group 27 includes a plurality of pads respectively corresponding to signals CEn, CLE, ALE, WEn, and REn, and provides coupling between the logic controller 12 and the NAND bus.

The ready/busy circuit 13 is coupled to the RB pad 28. The ready/busy circuit 13 transmits a ready/busy signal R/Bn to the controller 200 via the RB pad 28 in accordance with the operation state of the sequencer 18. The ready/busy circuit 13 may include the output circuit 10b.

The RB pad 28 provides coupling between the ready/busy circuit 13 and the NAND bus.

The status register 14 temporarily stores, for example, status information STS in a write operation, a read operation, and an erase operation, and notifies the controller 200 as to whether the operation has been completed normally or not.

The address register 15 temporarily stores an address ADD received from the controller 200 via the input/output circuit 10. The address ADD includes a row address RA and a column address CA. The address register 15 transfers a row address RA to the row decoder 20, and a column address CA to the column decoder 24.

The command register 16 temporarily stores the command CMD received from the controller 200 via the input/output circuit 10, and transfers the command CMD to the sequencer 18.

The Set_Feature circuit 17 stores a parameter setting for each of the various operations received from the controller 200, and sets a parameter in each of the various operations. For example, when the NAND flash memory 100 is activated (is turned on), the sequencer 18 performs an operation of reading a parameter from the Set_Feature circuit 17. The Set_Feature circuit 17 may be provided inside the sequencer 18, and a parameter setting may be stored in the memory cell array 21.

The sequencer 18 controls entire operations of the NAND flash memory 100. More specifically, the sequencer 18 controls, for example, the ZQ calibration circuit 11, the ready/busy circuit 13, the status register 14, the Set_Feature circuit 17, the voltage generator 19, the row decoder 20, the sense amplifier 22, the data register 23, the column decoder 24, etc., in accordance with the command CMD stored in the command register 16, and performs a write operation, a read operation, an erase operation, etc.

In accordance with the control by the sequencer 18, the voltage generator 19 generates a voltage necessary for a write operation, a read operation, and an erase operation, and supplies the generated voltages to, for example, the row decoder 20, the memory cell array 21, the sense amplifier 22, etc. The row decoder 20 and the sense amplifier 22 apply a voltage supplied from the voltage generator 19 to memory cell transistors in the memory cell array 21.

The memory cell array 21 includes a plurality of non-volatile memory cell transistors each of which is associated with a row and a column. In the memory cell array 21, information (hereinafter, referred to as "Ron information") based on an on-resistance Ron of a transistor measured in a test process before shipment of a product is stored in a nonvolatile manner. The Ron information is information for adjusting an output impedance to a set value. Based on the Ron information, a transistor size of an OCD to be described later within the output circuit 10b will be determined.

The row decoder 20 decodes a row address RA and based on a result of decoding, applies a necessary voltage to a selected memory cell transistor.

In a read operation, the sense amplifier 22 senses data read from the memory cell array 21. The sense amplifier 22 transmits read data RD to the data register 23. In a write operation, the sense amplifier 22 transmits write data WD to the memory cell array 21.

The data register 23 includes a plurality of latch circuits. The latch circuits store the write data WD and the read data RD. For example, in a write operation, the data register 23 temporarily stores the write data WD received from the input/output circuit 10, and transmits the write data WD to the sense amplifier 22. In a read operation, the data register 23 temporarily stores the read data RD received from the sense amplifier 22, and transmits the read data RD to the input/output circuit 10.

For example, in a write operation, a read operation, and an erase operation, the column decoder 24 decodes a column address CA, and selects a latch circuit in the data register 23 in accordance with a result of decoding.

1.1.3 Configuration of Input/Output Circuit 10

Next, a configuration of the input/output circuit 10 included in the NAND flash memory 100 according to the present embodiment will be described with reference to FIG. 2. FIG. 2 is a block diagram illustrating the input/output circuit 10 included in the NAND flash memory 100 according to the present embodiment with a focus on a coupling relationship between the respective structural elements within the output circuit 10b. The input/output circuit 10 shown in FIG. 2 omits the input circuits 10a<0> to 10a<7>.

As shown in FIG. 2, the input/output circuit 10 includes the output circuits 10b<0> to 10b<7>. Since the output circuits 10b<0> to 10b<7> have the same configuration, the output circuit 10b<0> will be described hereinafter.

The output circuit 10b<0> receives, from the data register 23, the read data RD (hereinafter, referred to as "data DAT_E<0>") read from the memory cell array 21. The output circuit 10b<0> further receives inversion data of the read data RD (hereinafter, referred to as "data DAT_O<0>")

and a clock signal CLK based on a signal REn and a signal BREn (an inversion signal of the signal REn). The output circuit 10b<0> selects data DAT_E<0> or data DAT_O<0> based on the clock signal CLK, and outputs the signal IO<0> based on the selected data to the controller 200 via the IO pad 25<0>.

The output circuit 10b<0> includes a multiplexer (MUX) 30<0>, an adjustment circuit 31<0>, an adjustment circuit 32<0>, drivers 33<0> to 39<0>, an OCD 40<0>, and an OCD 41<0>.

The MUX 30<0> receives the data DAT_E<0> via one input terminal and receives the data DAT_O<0> via the other input terminal. The MUX 30<0> receives the clock signal CLK as a control signal. The MUX 30<0> selects the data DAT_E<0> or the data DAT_O<0> based on the clock signal CLK, and transmits the selected data to the adjustment circuit 31<0>. For example, the MUX 30<0> selects the data DAT_E<0> when the clock signal CLK is at the "H" level, and selects the data DAT_O<0> when the clock signal CLK is at the "L" level.

The adjustment circuit 31<0> receives a signal from the MUX 30<0>. The adjustment circuit 31<0> adjusts a pulse width of a signal received from the MUX 30<0>, based on a control signal (not shown) received from the Set_Feature circuit 17, and transmits the adjusted signal to the adjustment circuit 32<0>.

The adjustment circuit 32<0> receives a signal from the adjustment circuit 31<0>. The adjustment circuit 32<0> adjusts a pulse width of a signal received from the adjustment circuit 31<0>, based on a control signal (not shown) received from the logic controller 12, and transmits the adjusted signal to the driver 33<0>.

The driver 33<0> receives a signal from the adjustment circuit 32<0>, and transmits a signal predicated on the received signal to the drivers 34<0> and 35<0>. In this manner, the drivers 34<0> and 35<0> are driven.

The driver 34<0> receives a signal from the driver 33<0> and transmits a signal predicated on the received signal to the driver 36<0>. In this manner, the driver 36<0> is driven.

The driver 35<0> receives a signal from the driver 33<0>, and transmits a signal predicated on the received signal to the driver 37<0>. In this manner, the driver 37<0> is driven.

The driver 36<0> receives a signal from the driver 34<0>, receives, from the ZQ calibration circuit 11, a Ron control signal for controlling an on-resistance Ron of a transistor in the OCD 40<0>, and transmits a signal predicated on these received signals to the driver 38<0>.

The driver 37<0> receives a signal from the driver 35<0>, receives, from the ZQ calibration circuit 11, a Ron control signal for controlling an on-resistance Ron of a transistor in the OCD 41<0>, and transmits a signal predicated on these received signals to the driver 39<0>.

The driver 38<0> receives a signal from the driver 36<0>, and transmits a signal predicated on the received signal to the OCD 40<0>. In this manner, the OCD 40<0> is driven.

The driver 39<0> receives a signal from the driver 37<0>, and transmits a signal predicated on the received signal to the OCD 41<0>. In this manner, the OCD 41<0> is driven.

The OCD 40<0> receives a signal from the driver 38<0>. The OCD 40<0> converts the received signal into an appropriate voltage level, and outputs the converted voltage to the controller 200 via the IO pad 25<0>.

The OCD 41<0> receives a signal from the driver 39<0>. The OCD 41<0> converts the received signal into an appropriate voltage level, and outputs the converted voltage to the controller 200 via the IO pad 25<0>.

A driver group 42<0> includes the driver 36<0>, the driver 38<0>, and the OCD 40<0>. A driver group 43<0> includes the driver 37<0>, the driver 39<0>, and the OCD 41<0>. A plurality of driver groups 42<0> and a plurality of driver groups 43<0> may be provided inside the output circuit 10b<0>. In such a case, the plurality of driver groups 42<0> are coupled in parallel. Furthermore, the plurality of driver groups 43<0> are coupled in parallel. To simplify the description, FIG. 2 illustrates one driver group 42<0> and one driver group 43<0>.

A configuration of the input/output circuit 10 included in the NAND flash memory 100 according to the present embodiment will be described with reference to FIG. 3. FIG. 3 is a block diagram illustrating the input/output circuit 10 included in the NAND flash memory 100 according to the present embodiment with a focus on an interconnect that provides coupling between power supply pads (a VCCQ pad and a VSS pad) and respective structural elements (hereinafter, referred to as "circuit units") in the output circuit 10b. The input/output circuit 10 shown in FIG. 3 omits the input circuits 10a<0> to 10a<7>. To simplify the description, with respect to the circuit units in each output circuit 10b, FIG. 3 illustrates the adjustment circuits 31 and 32 and omits the other circuit units.

As shown in FIG. 3, the NAND flash memory 100 includes IO circuit areas 50<0> to 50<7>. For example, the IO circuit areas 50<0> to 50<7> are arrayed to be adjacent to each other in the order of the IO circuit area 50<0>, the IO circuit area 50<1>, the IO circuit area 50<2>, . . . . In FIG. 3, the IO circuit areas 50<4> to 50<7> are omitted. Since the IO circuit areas 50<0> to 50<3> have the same configuration as that of the IO circuit areas 50<4> to 50<7>, the IO circuit areas 50<0> to 50<3> will be described hereinafter.

The IO circuit area 50<0> includes the output circuit 10b<0>, the IO pad 25<0>, a VCCQ pad 51<0>, a VSS pad 52<0>, a plurality of interconnects 53, an interconnect 54a, and a plurality of interconnects 54b.

The VCCQ pad 51<0> is a pad for externally supplying a power supply voltage VCCQ to the NAND flash memory 100. The VSS pad 52<0> is a pad for externally supplying a ground voltage VSS to the NAND flash memory 100.

In the IO circuit area 50<0>, the respective circuit units (the adjustment circuit 31<0>, the adjustment circuit 32<0>, . . . ) within the output circuit 10b<0> are coupled independently of each other to the VCCQ pad 51<0> with the interconnects 53 respectively intervening therebetween. Each interconnect 53 provides coupling between one of the power supply pads and a single circuit unit.

In the IO circuit area 50<0>, the interconnect 54a is coupled to the VSS pad 52<0>. The interconnect 54a is a common interconnect that provides coupling between one of the power supply pads and a plurality of circuit units. Each of the circuit units within the output circuit 10b<0> is coupled to the interconnect 54a coupled to the VSS pad 52<0>, with the interconnect 54b intervening between each of the circuit units and the interconnect 54a. Each interconnect 54b provides coupling between the interconnect 54a and a single circuit unit. Among interconnects stacked within the NAND flash memory 100, for example, the interconnect 54a corresponds to the topmost interconnect, and the interconnects 54b correspond to interconnects lower than the interconnect 54a.

The IO circuit area 50<1> includes the output circuit 10b<1>, the IO pad 25<1>, a VCCQ pad 51<0>, a VSS pad 52<1>, the plurality of interconnects 53, the interconnect 54*a*, and the plurality of interconnects 54*b*. The IO circuit area 50<1> shares the VCCQ pad 51<0> with the IO circuit area 50<0>.

In the IO circuit area 50<1>, the respective circuit units within the output circuit 10*b*<1> are coupled independently of each other to the VCCQ pad 51<0> with the interconnects 53 respectively intervening therebetween.

In the IO circuit area 50<1>, the interconnect 54*a* is coupled to the VSS pad 52<1>. Each of the circuit units within the output circuit 10*b*<1> is coupled to the interconnect 54*a* coupled to the VSS pad 52<1>, with the interconnect 54*b* intervening between each of the circuit units and the interconnect 54*a*.

The IO circuit area 50<2> includes the output circuit 10*b*<2>, the IO pad 25<2>, a VCCQ pad 51<1>, a VSS pad 52<1>, the plurality of interconnects 53, the interconnect 54*a*, and the plurality of interconnects 54*b*. The IO circuit area 50<2> shares the VSS pad 52<1> with the IO circuit area 50<1>.

In the IO circuit area 50<2>, the respective circuit units within the output circuit 10*b*<2> are coupled independently of each other to the VCCQ pad 51<1> with the interconnects 53 respectively intervening therebetween.

In the IO circuit area 50<2>, the interconnect 54*a* is coupled to the VSS pad 52<1>. Each of the circuit units within the output circuit 10*b*<2> is coupled to the interconnect 54*a* coupled to the VSS pad 52<1>, with the interconnect 54*b* intervening between each of the circuit units and the interconnect 54*a*.

The IO circuit area 50<3> includes the output circuit 10*b*<3>, the IO pad 25<3>, the VCCQ pad 51<1>, a VSS pad 52<2>, the plurality of interconnects 53, the interconnect 54*a*, and the plurality of interconnects 54*b*. The IO circuit area 50<3> shares the VCCQ pad 51<1> with the IO circuit area 50<2>.

In the IO circuit area 50<3>, the respective circuit units within the output circuit 10*b*<3> are coupled independently of each other to the VCCQ pad 51<1> with the interconnects 53 respectively intervening therebetween.

In the IO circuit area 50<3>, the interconnect 54*a* is coupled to the VSS pad 52<2>. Each of the circuit units within the output circuit 10*b*<3> is coupled to the interconnect 54*a* coupled to the VSS pad 52<2>, with the interconnect 54*b* intervening between each of the circuit units and the interconnect 54*a*.

1.1.4 Configuration of Output Circuit 10*b*

Next, a circuit configuration of the output circuit 10*b* included in the NAND flash memory 100 according to the present embodiment will be described with reference to FIG. 4. FIG. 4 is a circuit diagram showing one example of the output circuit 10*b* included in the NAND flash memory 100 according to the present embodiment. Since the output circuits 10*b*<0> to 10*b*<7> have the same configuration, details of respective circuit units within the output circuit 10*b*<0> will be described hereinafter.

As shown in FIG. 4, the adjustment circuit 31<0> includes variable inverters IV1 and IV2. The inverter IV1 receives a signal from the MUX 30<0>, and transmits, to the inverter IV2, a signal obtained by inverting a logical level of the received signal. The inverter IV2 receives a signal from the inverter IV1, and transmits, to the adjustment circuit 32<0>, a signal obtained by inverting a logical level of the received signal. The inverters IV1 and IV2 are adjustable in terms of inclination (speed) of rising and falling of received signals. The inverters IV1 and IV2 will be described later in detail.

Power supply voltage input terminals of the inverters IV1 and IV2 are coupled to the VCCQ pad 51<0> with the same interconnect 53 intervening therebetween. The power supply voltage input terminals of the inverters IV1 and IV2 may be coupled to the VCCQ pad 51<0> with the different interconnects 53 respectively intervening therebetween.

Ground voltage input terminals of the inverters IV1 and IV2 are coupled independently of each other to the interconnect 54*a* coupled to the VSS pad 52<0>, with the different interconnects 54*b* respectively intervening between the ground voltage input terminals and the interconnect 54*a*. The ground voltage input terminals of the inverters IV1 and IV2 may be coupled to the interconnect 54*a* with the same interconnect 54*b* intervening therebetween.

The adjustment circuit 32<0> includes variable inverters IV3 and IV4. The inverter IV3 receives a signal from the adjustment circuit 31<0>, and transmits, to the inverter IV4, a signal obtained by inverting a logical level of the received signal. The inverter IV4 receives a signal from the inverter IV3, and transmits, to the driver 33<0>, a signal obtained by inverting a logical level of the received signal. The inverters IV3 and IV4 are adjustable in terms of inclination (speed) of rising and falling of received signals. The inverters IV3 and IV4 may have the same configuration as that of the inverter IV1, for example.

Power supply voltage input terminals of the inverters IV3 and IV4 are coupled to the VCCQ pad 51<0> with the same interconnect 53 intervening therebetween. The power supply voltage input terminals of the inverters IV3 and IV4 may be coupled to the VCCQ pad 51<0> with the different interconnects 53 respectively intervening therebetween.

Ground voltage input terminals of the inverters IV3 and IV4 are coupled independently of each other to the interconnect 54*a* coupled to the VSS pad 52<0>, with the different interconnects 54*b* respectively intervening between the ground voltage input terminals and the interconnect 54*a*. The ground voltage input terminals of the inverters IV3 and IV4 may be coupled to the interconnect 54*a* with the same interconnect 54*b* intervening therebetween.

The driver 33<0> includes inverters IV5 to IV7. The inverter IV5 receives a signal from the adjustment circuit 32<0>, and transmits, to the inverter IV6, a signal obtained by inverting a logical level of the received signal. The inverter IV6 receives a signal from the inverter IV5, and transmits, to the inverter IV7, a signal obtained by inverting a logical level of the received signal. The inverter IV7 receives a signal from the inverter IV6, and transmits, to the drivers 34<0> and 35<0>, a signal obtained by inverting a logical level of the received signal.

Power supply voltage input terminals of the inverters IV5 to IV7 are coupled to the VCCQ pad 51<0> with the same interconnect 53 intervening therebetween. The power supply voltage input terminals of the inverters IV5 to IV7 may be coupled to the VCCQ pad 51<0> with the different interconnects 53 respectively intervening therebetween.

Ground voltage input terminals of the inverters IV5 to IV7 are coupled independently of each other to the interconnect 54*a* coupled to the VSS pad 52<0>, with the different interconnects 54*b* respectively intervening between the ground voltage input terminals and the interconnect 54*a*. The ground voltage input terminals of the inverters IV5 to IV7 may be coupled to the interconnect 54*a* with the same interconnect 54*b* intervening therebetween.

The driver 34<0> includes inverters IV8 to IV10. The inverter IV8 receives a signal from the driver 33<0>, and transmits, to the inverter IV9, a signal obtained by inverting a logical level of the received signal. The inverter IV9 receives a signal from the inverter IV8, and transmits, to the inverter IV10, a signal obtained by inverting a logical level of the received signal. The inverter IV10 receives a signal from the inverter IV9, and transmits, to the driver 36<0>, a signal obtained by inverting a logical level of the received signal.

Power supply voltage input terminals of the inverters IV8 to IV10 are coupled to the VCCQ pad 51<0> with the same interconnect 53 intervening therebetween. The power supply voltage input terminals of the inverters IV8 to IV10 may be coupled to the VCCQ pad 51<0> with the different interconnects 53 respectively intervening therebetween.

Ground voltage input terminals of the inverters IV8 to IV10 are coupled independently of each other to the interconnect 54a coupled to the VSS pad 52<0>, with the different interconnects 54b respectively intervening between the ground voltage input terminals and the interconnect 54a. The ground voltage input terminals of the inverters IV8 to IV10 may be coupled to the interconnect 54a with the same interconnect 54b intervening therebetween.

The driver 35<0> includes inverters IV11 to IV13. The inverter IV11 receives a signal from the driver 33<0>, and transmits, to the inverter IV12, a signal obtained by inverting a logical level of the received signal. The inverter IV12 receives a signal from the inverter IV11, and transmits, to the inverter IV13, a signal obtained by inverting a logical level of the received signal. The inverter IV13 receives a signal from the inverter IV12, and transmits, to the driver 37<0>, a signal obtained by inverting a logical level of the received signal.

Power supply voltage input terminals of the inverters IV11 to IV13 are coupled to the VCCQ pad 51<0> with the same interconnect 53 intervening therebetween. The power supply voltage input terminals of the inverters IV11 to IV13 may be coupled to the VCCQ pad 51<0> with the different interconnects 53 respectively intervening therebetween.

Ground voltage input terminals of the inverters IV11 to IV13 are coupled independently of each other to the interconnect 54a coupled to the VSS pad 52<0>, with the different interconnects 54b respectively intervening between the ground voltage input terminals and the interconnect 54a. The ground voltage input terminals of the inverters IV11 to IV13 may be coupled to the interconnect 54a with the same interconnect 54b intervening therebetween.

The driver 36<0> includes NAND circuits ND1 and ND2.

In the NAND circuit ND1, an output signal from the driver 34<0> is input to one input terminal, and a Ron control signal CTL1 received from the ZQ calibration circuit 11 is input to the other input terminal. Based on these input signals, the NAND circuit ND1 performs a NAND operation. The NAND circuit ND1 then transmits an operation result (signal) to the NAND circuit ND2.

In the NAND circuit ND2, an output signal from the NAND circuit ND1 is input to one input terminal, and a Ron control signal CTL2 received from the ZQ calibration circuit 11 is input to the other input terminal. Based on these input signals, the NAND circuit ND2 performs a NAND operation. The NAND circuit ND2 then transmits an operation result (signal) to the driver 38<0>.

Power supply voltage input terminals of the NAND circuits ND1 and ND2 are coupled to the VCCQ pad 51<0> with the same interconnect 53 intervening therebetween. The power supply voltage input terminals of the NAND circuits ND1 and ND2 may be coupled to the VCCQ pad 51<0> with the different interconnects 53 respectively intervening therebetween.

Ground voltage input terminals of the NAND circuits ND1 and ND2 are coupled independently of each other to the interconnect 54a coupled to the VSS pad 52<0>, with the different interconnects 54b respectively intervening between the ground voltage input terminals and the interconnect 54a. The ground voltage input terminals of the NAND circuits ND1 and ND2 may be coupled to the interconnect 54a with the same interconnect 54b intervening therebetween.

The driver 37<0> includes NAND circuits ND3 and ND4.

In the NAND circuit ND3, an output signal from the driver 35<0> is input to one input terminal, and a Ron control signal CTL3 received from the ZQ calibration circuit 11 is input to the other input terminal. Based on these input signals, the NAND circuit ND3 performs a NAND operation. The NAND circuit ND3 then transmits an operation result (signal) to the NAND circuit ND4.

In the NAND circuit ND4, an output signal from the NAND circuit ND3 is input to one input terminal, and a Ron control signal CTL4 received from the ZQ calibration circuit 11 is input to the other input terminal. Based on these input signals, the NAND circuit ND4 performs a NAND operation. The NAND circuit ND4 then transmits an operation result (signal) to the driver 39<0>.

Power supply voltage input terminals of the NAND circuits ND3 and ND4 are coupled to the VCCQ pad 51<0> with the same interconnect 53 intervening therebetween. The power supply voltage input terminals of the NAND circuits ND3 and ND4 may be coupled to the VCCQ pad 51<0> with the different interconnects 53 respectively intervening therebetween.

Ground voltage input terminals of the NAND circuits ND3 and ND4 are coupled independently of each other to the interconnect 54a coupled to the VSS pad 52<0>, with the different interconnects 54b respectively intervening between the ground voltage input terminals and the interconnect 54a. The ground voltage input terminals of the NAND circuits ND3 and ND4 may be coupled to the interconnect 54a with the same interconnect 54b intervening therebetween.

The driver 38<0> includes an inverter IV14. The inverter IV14 receives a signal from the driver 36<0>, and transmits, to the OCD 40<0>, a signal obtained by inverting a logical level of the received signal.

A power supply voltage input terminal of the inverter IV14 is coupled to the VCCQ pad 51<0> with the interconnect 53 intervening therebetween. A ground voltage input terminal of the inverter IV14 is coupled to the interconnect 54a coupled to the VSS pad 52<0>, with the interconnect 54b intervening between the ground voltage input terminal and the interconnect 54a.

The driver 39<0> includes an inverter IV15. The inverter IV15 receives a signal from the driver 37<0>, and transmits, to the OCD 41<0>, a signal obtained by inverting a logical level of the received signal.

A power supply voltage input terminal of the inverter IV15 is coupled to the VCCQ pad 51<0> with the interconnect 53 intervening therebetween. A ground voltage input terminal of the inverter IV15 is coupled to the interconnect 54a coupled to the VSS pad 52<0>, with the interconnect 54b intervening between the ground voltage input terminal and the interconnect 54a.

The OCD 40<0> includes a p-channel MOS transistor TR1. An output signal of the driver 38<0> is input to a gate of the transistor TR1. The power supply voltage VCCQ is applied to a source of the transistor TR1. A drain of the transistor TR1 is coupled to a node N1. The node N1 is coupled to the IO pad 25<0>.

The OCD 41<0> includes an n-channel MOS transistor TR2. An output signal of the driver 39<0> is input to a gate of the transistor TR2. The ground voltage VSS is applied to a source of the transistor TR2. A drain of the transistor TR2 is coupled to the node N1.

The driver group 42<0> controls ON/OFF of the transistor TR1 of the OCD 40<0> in accordance with the Ron control signals CTL1 and CTL2. For example, when the power supply is in an ON state, the driver group 42<0> receives, from the ZQ calibration circuit 11, the Ron control signal CTL1 at the "H" level/"L" level, and the Ron control circuit CTL2 at the "H" level. In accordance with the logical level ("H" level/"L" level) of the Ron control signal CTL1, the ON/OFF of the transistor TR1 of the OCD 40<0> is controlled.

In the case where the number of driver groups 42<0> is n (where n is an integer equal to or greater than 2), the ZQ calibration circuit 11 respectively controls n Ron control signals CTL1 and n Ron control signals CTL2 which are respectively transmitted to the n driver groups 42<0>, thereby being able to respectively control the ON/OFF of the transistors TR1 of the n OCDs 40<0>. In this manner, a combined on-resistance of the transistors TR1 of the n OCDs 40<0> can be adjusted.

The driver group 43<0> controls ON/OFF of the transistor TR2 of the OCD 41<0> in accordance with the Ron control signals CTL3 and CTL4. For example, when the power supply is in an ON state, the driver group 43<0> receives, from the ZQ calibration circuit 11, the Ron control signal CTL3 at the "H" level, and the Ron control circuit CTL4 at the "H" level/"L" level. In accordance with the logical level ("H" level/"L" level) of the Ron control signal CTL4, the ON/OFF of the transistor TR2 of the OCD 41<0> is controlled.

In the case where the number of driver groups 43<0> is n, the ZQ calibration circuit 11 respectively controls n Ron control signals CTL3 and n Ron control signals CTL4 which are respectively transmitted to the n driver groups 43<0>, thereby being able to respectively control the ON/OFF of the transistors TR2 of the n OCDs 41<0>. In this manner, a combined on-resistance of the transistors TR2 of the n OCDs 41<0> can be adjusted.

1.1.5 Configuration of Adjustment Circuit 31

Figure 5:
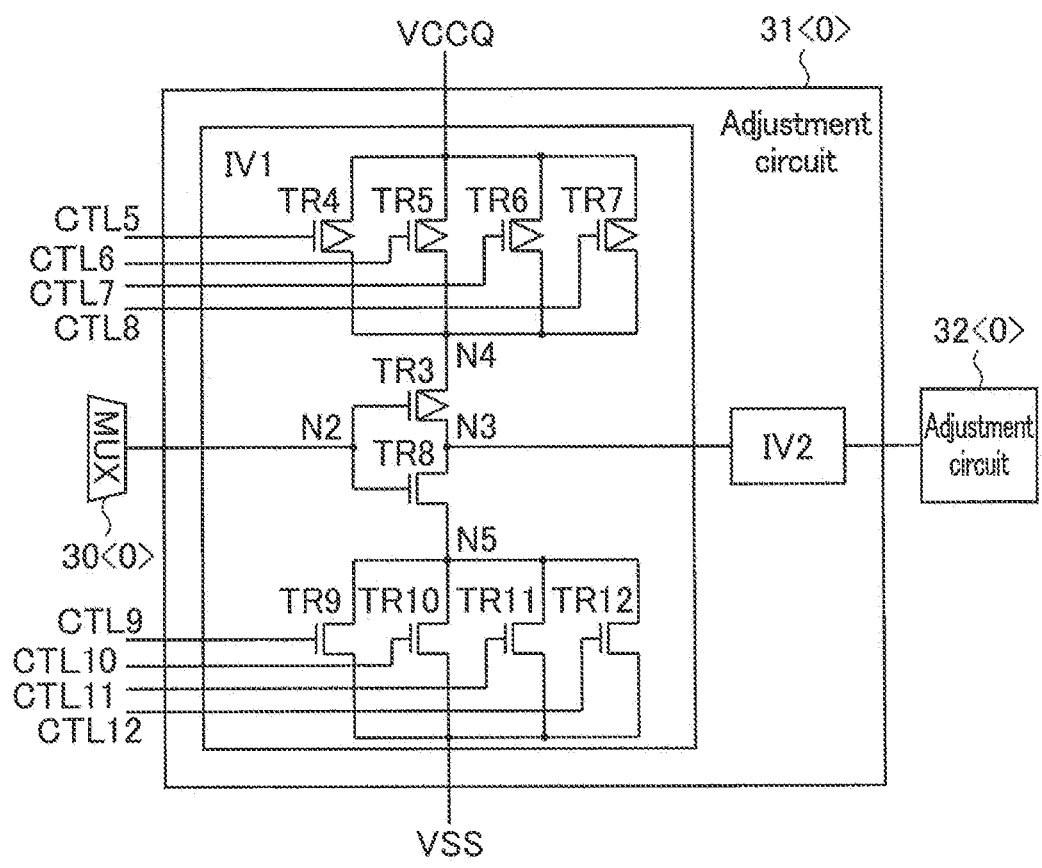
FIG. 5 is a circuit diagram showing one example of an adjustment circuit included in the semiconductor memory device according to the first embodiment.

Next, a circuit configuration of the adjustment circuit 31 included in the NAND flash memory 100 according to the present embodiment will be described with reference to FIG. 5. FIG. 5 is a circuit diagram showing one example of the adjustment circuit 31 included in the NAND flash memory 100 according to the present embodiment. Since the adjustment circuits 31<0> to 31<7> have the same configuration and the inverters IV1 and IV2 in the adjustment circuits 31<0> have the same configuration, details of the inverter IV1 within the adjustment circuit 31<0> will be described hereinafter.

The inverter IV1 includes p-channel MOS transistors TR3 to TR7 and n-channel MOS transistors TR8 to TR12. Hereinafter, when a source and a drain of a transistor are not distinguished from each other, one of them will be referred to as "a first end of a transistor" and the other of them will be referred to as "a second end of the transistor".

A gate of the transistor TR3 is coupled to a node N2. The node N2 is coupled to the MUX 30<0>. The first end of the transistor TR3 is coupled to a node N4. The second end of the transistor TR3 is coupled to a node N3. The node N3 is coupled to the inverter IV2.

Control signals CTL5 to CTL 8 received from the Set_Feature circuit 17 are respectively input to gates of the transistors TR4 to TR7. The power supply voltage VCCQ is applied to each of the first ends of the transistors TR4 to TR7. Each of the second ends of the transistors TR4 to TR7 is coupled to the node N4. By controlling ON/OFF of the transistors TR4 to TR7 based on the control signals CTL5 to CTL8, respectively, a combined on-resistance Ronp of the transistors TR4 to TR7 is adjusted.

For example, in the case of the signal CTL5 being "0", the signal CTL6 being "0", the signal CTL 7 being "0", and the signal CTL8 being "0", the transistors TR4 to TR7 are turned on and the combined on-resistance Ronp of the transistors TR4 to TR7 becomes the minimum. In this case, when an output of the inverter IV1 by the transistors TR3 and TR8 is reversed from the "L" level to the "H" level, a rising of a voltage becomes relatively steep.

In addition, in the case of, for example, the signal CTL5 being "1", the signal CTL6 being "1", the signal CTL 7 being "1", and the signal CTL8 being "0", the transistors TR4 to TR6 are turned off, the transistor TR7 is turned on, and the combined on-resistance Ronp of the transistors TR4 to TR7 becomes the maximum. In this case, when an output of the inverter IV1 by the transistors TR3 and TR8 is reversed from the "L" level to the "H" level, rising of a voltage becomes relatively gentle.

The transistors TR4 to TR7 may be equal or different in terms of transistor size. The number of p-channel MOS transistors provided to adjust the combined on-resistance Ronp is not limited to four and may be set to any number.

A gate of the transistor TR8 is coupled to the node N2. The first end of the transistor TR8 is coupled to the node N5. The second end of the transistor TR8 is coupled to the node N3.

Control signals CTL9 to CTL12 received from the Set_Feature circuit 17 are respectively input to gates of the transistors TR9 to TR12. The ground voltage VSS is applied to each of the first ends of the transistors TR9 to TR12. Each of the second ends of the transistors TR9 to TR12 is coupled to the node N5. By controlling ON/OFF of the transistors TR9 to TR12 based on the control signals CTL9 to CTL12, respectively, a combined on-resistance Ronn of the transistors TR9 to TR12 is adjusted.

For example, in the case of the signal CTL9 being "1", the signal CTL10 being "1", the signal CTL11 being "1", and the signal CTL12 being "1", the transistors TR9 to TR12 are turned on and the combined on-resistance Ronn of the transistors TR9 to TR12 becomes the minimum. In this case, when an output of the inverter IV1 by the transistors TR3 and TR8 is reversed from the "H" level to the "L" level, falling of a voltage becomes relatively steep.

In addition, in the case of, for example, the signal CTL9 being "0", the signal CTL10 being "0", the signal CTL11 being "0", and the signal CTL12 being "1", the transistors TR9 to TR11 are turned off, the transistor TR12 is turned on, and the combined on-resistance Ronn of the transistors TR9 to TR12 becomes the maximum. In this case, when an output of the inverter IV1 by the transistors TR3 and TR8 is reversed from the "H" level to the "L" level, falling of a voltage becomes relatively gentle.

The transistors TR9 to TR12 may be equal or different in terms of transistor size. The number of n-channel MOS transistors provided to adjust the combined on-resistance Ronn is not limited to four and may be set to any number.

As with the inverter IV1, in the inverter IV2 also, its output is adjusted.

By adjusting an output in each of the inverters IV1 and IV2, a pulse width of a signal received from the MUX 30<0> is adjusted. For example, in the case of adjusting a pulse width of a signal to be small, the inverter IV1 is adjusted to increase a time for a voltage to fall. In accordance with the amount of voltage corresponding to the increase in time for the voltage to fall, the inverter IV2 is adjusted to increase a time for a voltage to rise. In the case of adjusting a pulse width of a signal to be large, the inverter IV1 is adjusted to decrease a time for a voltage to rise. In accordance with the amount of voltage corresponding to the decrease in time for the voltage to rise, the inverter IV2 is adjusted to decrease a time for a voltage to fall.

1.1.6 Configuration of Adjustment Circuit 32

Next, a circuit configuration of the adjustment circuit 32 included in the NAND flash memory 100 according to the present embodiment will be described. The adjustment circuit 32 is the same as the adjustment circuit 31 except that the adjustment circuit 32 receives an output signal of the adjustment circuit 31, receives the control signals CTL5 to CTL12 from the logic controller 12, and outputs a signal to the driver 33<0>. Accordingly, as with the adjustment circuit 31, the adjustment circuit 32 is capable of adjusting a pulse width of a signal received from the adjustment circuit 31<0>.

1.2 Operation of Output Circuit 10*b*

Next, an operation of the output circuit 10*b* included in the NAND flash memory 100 according to the present embodiment will be described with reference to FIG. 6 and FIG. 7. Since the output circuits 10*b*<0> to 10*b*<7> perform the same operation, an operation of the output circuit 10*b*<0> will be described hereinafter.

First, the case in which the data DAT_E<0> is equal to "1" will be described with reference to FIG. 6. FIG. 6 is a diagram illustrating an operation of the output circuit 10*b*<0> in the case where the data DAT_E<0> is equal to "1".

As illustrated in FIG. 6, the MUX 30<0> receives the data DAT_E<0> ("1") from the data register 23. The MUX 30<0> receives the data DAT_O<0> ("0") and the clock signal CLK based on the signals REn and BREn. When the clock signal CLK is at the "H" level, the MUX 30<0> selects the data DAT_E<0> ("1"), and transmits a signal at the "H" level to the adjustment circuit 31<0>.

The adjustment circuit 31<0> receives a signal at the "H" level from the MUX 30<0>, and transmits a signal at the "H" level to the adjustment circuit 32<0> via the inverters IV1 and IV2.

The adjustment circuit 32<0> receives a signal at the "H" level from the adjustment circuit 31<0>, and transmits a signal at the "H" level to the driver 33<0> via the inverters IV3 and IV4.

The driver 33<0> receives a signal at the "H" level from the adjustment circuit 32<0>, and transmits a signal at the "L" level to the drivers 34<0> and 35<0> via the inverters IV5 to IV7.

The driver 34<0> receives a signal at the "L" level from the driver 33<0>, and transmits a signal at the "H" level to the driver 36<0> via the inverters IV8 to IV10.

The driver 35<0> receives a signal at the "L" level from the driver 33<0>, and transmits a signal at the "H" level to the driver 37<0> via the inverters IV11 to IV13.

The driver 36<0> receives a signal at the "H" level from the driver 34<0>, receives the Ron control signal CTL1 at the "H" level and the Ron control signal CTL2 at the "H" level from the ZQ calibration circuit 11, and transmits a signal at the "H" level to the driver 38<0> via the NAND circuits ND1 and ND2.

The driver 37<0> receives a signal at the "H" level from the driver 35<0>, receives the Ron control signal CTL3 at the "H" level and the Ron control signal CTL4 at the "H" level from the ZQ calibration circuit 11, and transmits a signal at the "H" level to the driver 39<0> via the NAND circuits ND3 and ND4.

The driver 38<0> receives a signal at the "H" level from the driver 36<0>, and transmits a signal at the "L" level to the OCD 40<0> via the inverter IV14.

The driver 39<0> receives a signal at the "H" level from the driver 37<0>, and transmits a signal at the "L" level to the OCD 41<0> via the inverter IV15.

The OCD 40<0> receives a signal at the "L" level from the driver 38<0>. A signal at the "L" level is input to a gate of the transistor TR1 while the power supply voltage VCCQ is applied to the first end of the transistor TR1, and as a result, the transistor TR1 is turned on.

The OCD 41<0> receives a signal at the "L" level from the driver 39<0>. A signal at the "L" level is input to a gate of the transistor TR2 while a ground voltage VSS is applied to the first end of the transistor TR2, and as a result, the transistor TR2 is turned off.

Accordingly, the voltage VCCQ is applied to the node N1. This causes the IO pad 25<0> to output a signal at the "H" level.

Next, the case in which the data DAT_E<0> is equal to "0" will be described with reference to FIG. 7. FIG. 7 is a diagram illustrating an operation of the output circuit 10*b*<0> in the case where the data DAT_E<0> is equal to "0".

Figure 7:
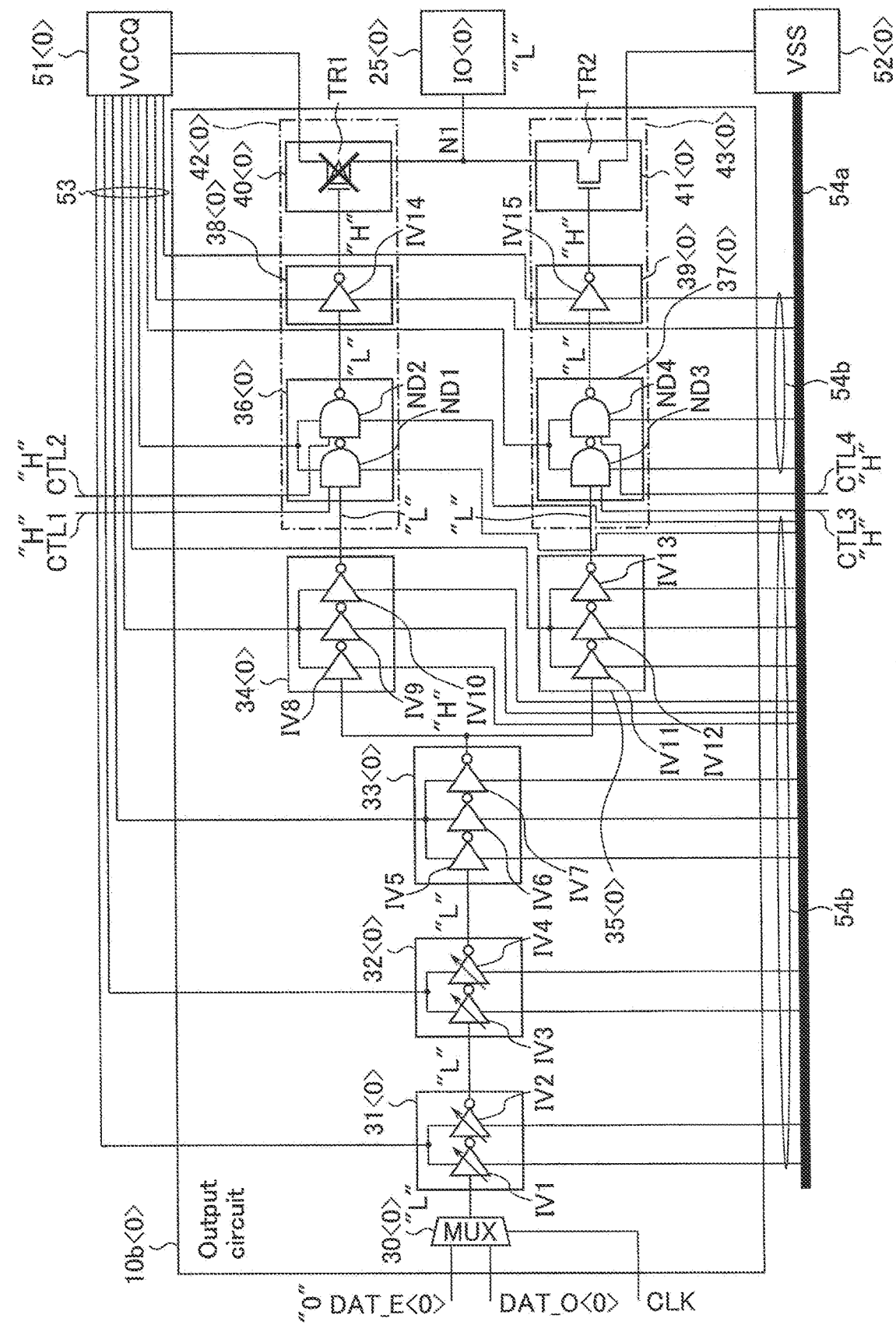
FIG. 7 is a diagram illustrating an operation of the output circuit included in the semiconductor memory device according to the first embodiment.

As illustrated in FIG. 7, the MUX 30<0> receives the data DAT_E<0> ("0") from the data register 23. The MUX 30<0> receives the data DAT_O<0> ("1") and the clock signal CLK based on the signals REn and BREn. When the clock signal CLK is at the "H" level, the MUX 30<0> selects the data DAT_E<0> ("0"), and transmits a signal at the "L" level to the adjustment circuit 31<0>.

The adjustment circuit 31<0> receives a signal at the "L" level from the MUX 30<0>, and transmits a signal at the "L" level to the adjustment circuit 32<0> via the inverters IV1 and IV2.

The adjustment circuit 32<0> receives a signal at the "L" level from the 31<0>, and transmits a signal at the "L" level to the driver 33<0> via the inverters IV3 and IV4.

The driver 33<0> receives a signal at the "L" level from the adjustment circuit 32<0>, and transmits a signal at the "H" level to the drivers 34<0> and 35<0> via the inverters IV5 to IV7.

The driver 34<0> receives a signal at the "H" level from the driver 33<0>, and transmits a signal at the "L" level to the driver 36<0> via the inverters IV8 to IV10.

The driver 35<0> receives a signal at the "H" level from the driver 33<0>, and transmits a signal at the "L" level to the driver 37<0> via the inverters IV11 to IV13.

The driver 36<0> receives a signal at the "L" level from the driver 34<0>, receives the Ron control signal CTL1 at the "H" level and the Ron control signal CTL2 at the "H" level from the ZQ calibration circuit 11, and transmits a signal at the "L" level to the driver 38<0> via the NAND circuits ND1 and ND2.

The driver 37<0> receives a signal at the "L" level from the driver 35<0>, receives the Ron control signal CTL3 at the "H" level and the Ron control signal CTL4 at the "H" level from the ZQ calibration circuit 11, and transmits a signal at the "L" level to the driver 39<0> via the NAND circuits ND3 and ND4.

The driver 38<0> receives a signal at the "L" level from the driver 36<0>, and transmits a signal at the "H" level to the OCD 40<0> via the inverter IV14.

The driver 39<0> receives a signal at the "L" level from the driver 37<0>, and transmits a signal at the "H" level to the OCD 41<0> via the inverter IV15.

The OCD 40<0> receives a signal at the "H" level from the driver 38<0>. A signal at the "H" level is input to a gate of the transistor TR1 while the power supply voltage VCCQ is applied to the first end of the transistor TR1, and as a result, the transistor TR1 is turned off.

The OCD 41<0> receives a signal at the "H" level from the driver 39<0>. A signal at the "H" level is input to a gate of the transistor TR2 while a ground voltage VSS is applied to the first end of the transistor TR2, and as a result, the transistor TR2 is turned on.

Accordingly, the voltage VSS is applied to the node N1. This causes the IO pad 25<0> to output a signal at the "L" level.

1.3 Advantageous Effect

The configuration according to the present embodiment can improve the operational reliability of the semiconductor memory device. This advantageous effect will be described below.

In each of the circuit units within the output circuit 10*b*, operations are switched at the time when the data DAT_E<0> is switched. This causes a voltage drop of the power supply voltage VCCQ.

In a power supply voltage in the case where the same power supply voltage interconnect is shared by the respective circuit units, a voltage drop corresponds to a combined voltage drop in the circuit units. If a frequency of the clock signal CLK increases, the timing when a voltage drop occurs may overlap between the circuit units.

This raises the possibility that a voltage drop will increase in each of the circuit units to cause a delay in circuit operation. As a result, the possibility of causing a deviation in timing of outputting a signal in the output circuits 10*b* increases as compared with the case in which a frequency of the clock signal CLK is lower.

With the configuration according to the present embodiment, the respective circuit units are coupled to the VCCQ pad 51<0> with the different interconnects 53 respectively intervening therebetween. Therefore, the respective circuit units can prevent an increase in voltage drop, thereby being able to prevent a delay in circuit operation. This can prevent a deviation in timing of outputting a signal in output circuits 10*b*, thereby achieving an improvement in operation reliability.

2. Second Embodiment

A semiconductor memory device according to a second embodiment will be described. The semiconductor memory device according to the present embodiment differs from that of the first embodiment in that the respective circuit units of the output circuit 10*b* are coupled independently of each other to the interconnect 53*a* coupled to the VCCQ pad 51, with the different interconnects 53*b* respectively intervening between the circuit units and the interconnect 53*a*, and are coupled independently of each other to the VSS pad 52 with the different interconnects 54 respectively intervening between circuit units and the VSS pad 52. The following description will in principle concentrate on the features different from the first embodiment.

2.1 Configuration of Input/Output Circuit 10

Figure 8:
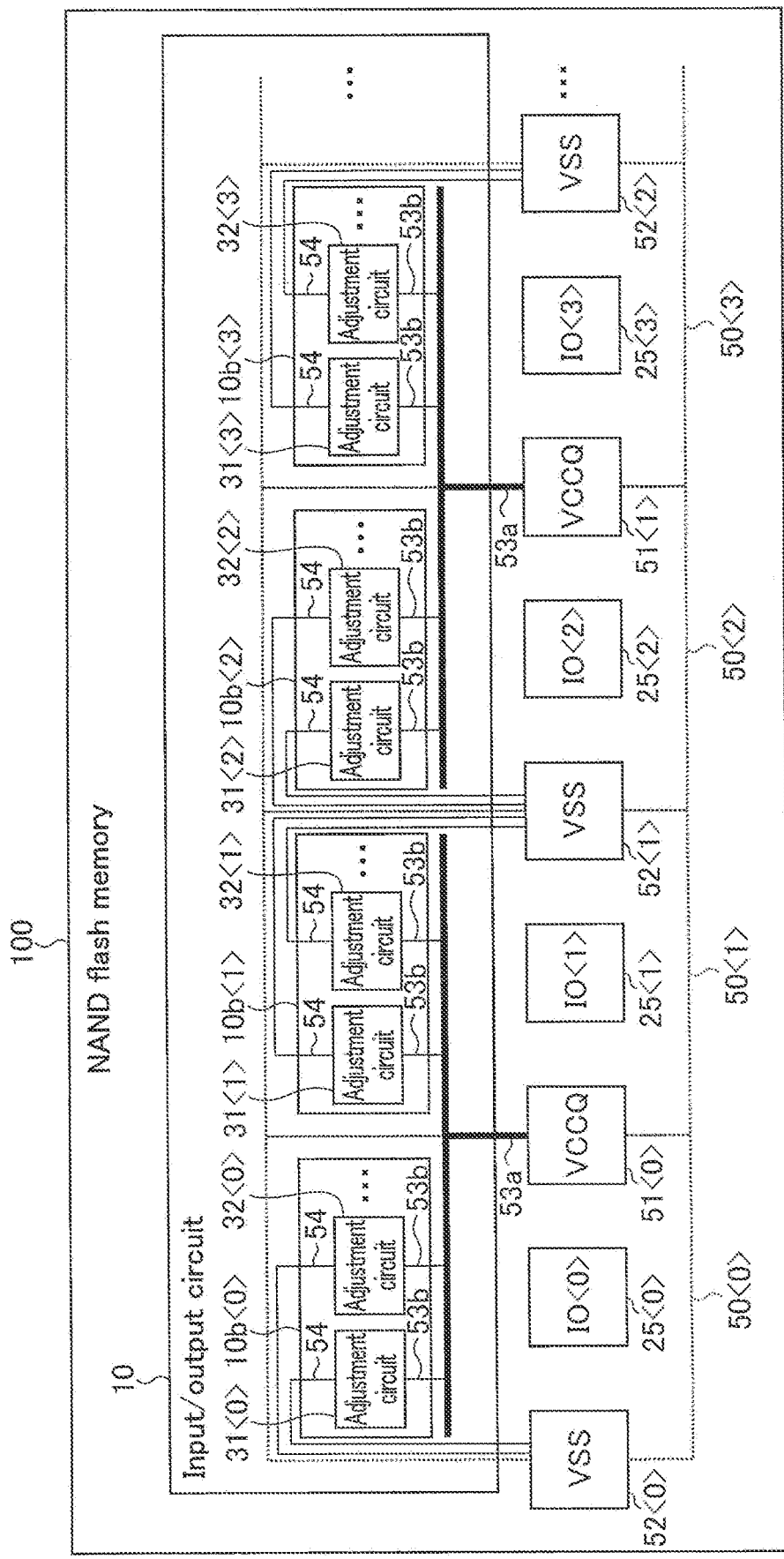
FIG. 8 is a block diagram of an input/output circuit included in a semiconductor memory device according to a second embodiment.

A configuration of the input/output circuit 10 included in the NAND flash memory 100 according to the present embodiment will be described with reference to FIG. 8. FIG. 8 is a block diagram showing the input/output circuit 10 included in the NAND flash memory 100 according to the present embodiment. The input/output circuit 10 shown in FIG. 8 omits the input circuits 10*a*<0> to 10*a*<7>. To simplify the description, with respect to the circuit units in each output circuit 10*b*, FIG. 8 illustrates the adjustment circuits 31 and 32 and omits the other circuit units. In FIG. 8, the IO circuit areas 50<4> to 50<7> are omitted. Since the IO circuit areas 50<0> to 50<3> have the same configuration as that of the IO circuit areas 50<4> to 50<7>, the IO circuits 50<0> to 50<3> will be described hereinafter.

As shown in FIG. 8, the IO circuit area 50<0> includes the output circuit 10*b*<0>, the IO pad 25<0>, the VCCQ pad 51<0>, the VSS pad 52<0>, the interconnect 53*a*, the plurality of interconnects 53*b*, and the plurality of interconnects 54.

In the IO circuit area 50<0>, the interconnect 53*a* is coupled to the VCCQ pad 51<0>. The interconnect 53*a* is a common interconnect that provides coupling between one of the power supply pads and a plurality of circuit units. Each of the circuit units (the adjustment circuit 31<0>, the adjustment circuit 32<0>, . . . ) within the output circuit 10*b*<0> is coupled to the interconnect 53*a* coupled to the VCCQ pad 51<0>, with the interconnect 53*b* intervening between each of the circuit units and the interconnect 53*a*. Each interconnect 53*b* provides coupling between the interconnect 53*a* and a single circuit unit. Among interconnects stacked within the NAND flash memory 100, for example, the interconnect 53*a* corresponds to the topmost interconnect, and the interconnects 53*b* correspond to interconnects lower than the interconnect 53*a*.

Furthermore, in the IO circuit area 50<0>, the respective circuit units within the output circuit 10*b*<0> are coupled independently of each other to the VSS pad 52<0> with the interconnects 54 respectively intervening therebetween. Each interconnect 54 provides coupling between one of the power supply pads and a single circuit unit.

The IO circuit area 50<1> includes the output circuit 10*b*<1>, the IO pad 25<1>, the VCCQ pad 51<0>, the VSS pad 52<1>, the interconnect 53*a*, the plurality of interconnects 53*b*, and the plurality of interconnects 54.

In the IO circuit area 50<1>, the interconnect 53*a* is coupled to the VCCQ pad 51<0>. Each of the circuit units within the output circuit 10*b*<1> is coupled to the interconnect 53*a* coupled to the VCCQ pad 51<0>, with the interconnect 53*b* intervening between each of the circuit units and the interconnect 53*a*.

Furthermore, in the IO circuit area 50<1>, the respective circuit units within the output circuit 10*b*<1> are coupled independently of each other to the VSS pad 52<1> with the interconnects 54, respectively intervening therebetween.

The IO circuit area 50<2> includes the output circuit 10*b*<2>, the IO pad 25<2>, the VCCQ pad 51<1>, the VSS pad 52<1>, the interconnect 53*a*, the plurality of interconnects 53*b*, and the plurality of interconnects 54.

In the IO circuit area 50<2>, the interconnect 53*a* is coupled to the VCCQ pad 51<1>. Each of the circuit units within the output circuit 10*b*<2> is coupled to the interconnect 53*a* coupled to the VCCQ pad 51<1>, with the interconnect 53*b* intervening between each of the circuit units and the interconnect 53*a*.

Furthermore, in the IO circuit area 50<2>, the respective circuit units within the output circuit 10*b*<2> are coupled independently of each other to the VSS pad 52<1> with the interconnects 54 respectively intervening therebetween.

The IO circuit area 50<3> includes the output circuit 10*b*<3>, the IO pad 25<3>, the VCCQ pad 51<1>, the VSS pad 52<2>, the interconnect 53a, the plurality of interconnects 53b, and the plurality of interconnects 54.

In the IO circuit area 50<3>, the interconnect 53a is coupled to the VCCQ pad 51<1>. Each of the circuit units within the output circuit 10b<3> is coupled to the interconnect 53a coupled to the VCCQ pad 51<1>, with the interconnect 53b intervening between each of the circuit units and the interconnect 53a.

Furthermore, in the IO circuit area 50<3>, the respective circuit units within the output circuit 10b<3> are coupled independently of each other to the VSS pad 52<2> with the interconnects 54 respectively intervening therebetween.

2.2 Configuration of Output Circuit 10b

Figure 9:
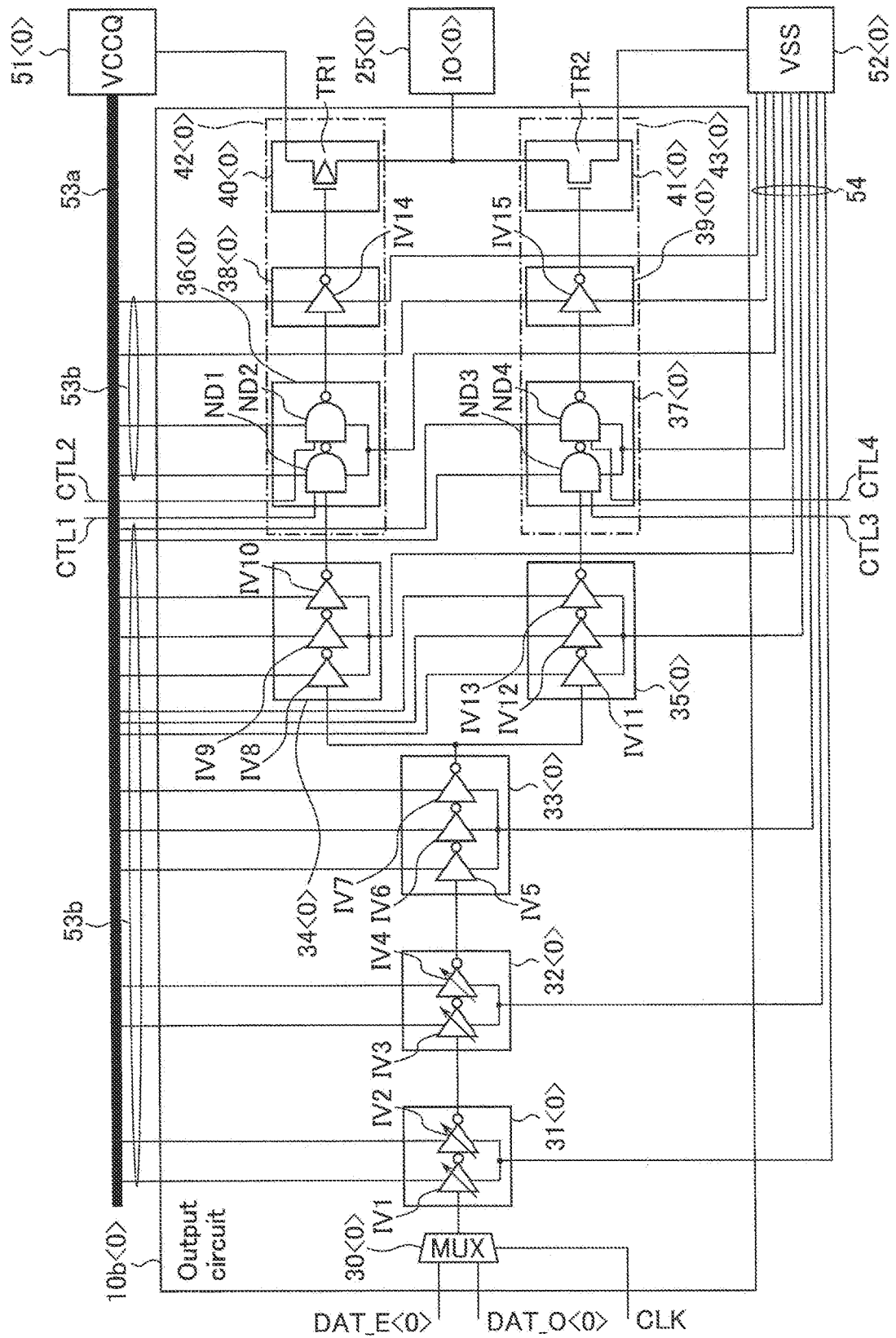
FIG. 9 is a circuit diagram showing one example of an output circuit included in the semiconductor memory device according to the second embodiment.

Next, a circuit configuration of the output circuit 10b included in the NAND flash memory 100 according to the present embodiment will be described with reference to FIG. 9. FIG. 9 is a circuit diagram showing one example of the output circuit 10b included in the NAND flash memory 100 according to the present embodiment. Since the output circuits 10b<0> to 10b<7> have the same configuration, details of respective circuit units within the output circuit 10b<0> will be described hereinafter.

As shown in FIG. 9, power supply voltage input terminals of the inverters IV1 and IV2 are coupled independently of each other to the interconnect 53a coupled to the VCCQ pad 51<0>, with the different interconnects 53b respectively intervening between the power supply voltage input terminals and the interconnect 53a. The power supply voltage input terminals of the inverters IV1 and IV2 may be coupled to the interconnect 53a with the same interconnect 53b intervening therebetween.

Ground voltage input terminals of the inverters IV1 and IV2 are coupled to the VSS pad 52<0> with the same interconnect 54 intervening therebetween. The ground voltage input terminals of the inverters IV1 and IV2 may be coupled to the VSS pad 52<0> with the different interconnects 54 respectively intervening therebetween.

Power supply voltage input terminals of the inverters IV3 and IV4 are coupled independently of each other to the interconnect 53a coupled to the VCCQ pad 51<0>, with the different interconnects 53b respectively intervening between the power supply voltage input terminals and the interconnect 53a. The power supply voltage input terminals of the inverters IV3 and IV4 may be coupled to the interconnect 53a with the same interconnect 53b intervening therebetween.

Ground voltage input terminals of the inverters IV3 and IV4 are coupled to the VSS pad 52<0> with the same interconnect 54 intervening therebetween. The ground voltage input terminals of the inverters IV3 and IV4 may be coupled to the VSS pad 52<0> with the different interconnects 54 respectively intervening therebetween.

Power supply voltage input terminals of the inverters IV5 to IV7 are coupled independently of each other to the interconnect 53a coupled to the VCCQ pad 51<0>, with the different interconnects 53b respectively intervening between the power supply voltage input terminals and the interconnect 53a. The power supply voltage input terminals of the inverters IV5 to IV7 may be coupled to the interconnect 53a with the same interconnect 53b intervening therebetween.

Ground voltage input terminals of the inverters IV5 to IV7 are coupled to the VSS pad 52<0> with the same interconnect 54 intervening therebetween. The ground voltage input terminals of the inverters IV5 to IV7 may be coupled to the VSS pad 52<0> with the different interconnects 54 respectively intervening therebetween.

Power supply voltage input terminals of the inverters IV8 to IV10 are coupled independently of each other to the interconnect 53a coupled to the VCCQ pad 51<0>, with the different interconnects 53b respectively intervening between the power supply voltage input terminal and the interconnect 53a. The power supply voltage input terminals of the inverters IV8 to IV10 may be coupled to the interconnect 53a with the same interconnect 53b intervening therebetween.

Ground voltage input terminals of the inverters IV8 to IV10 are coupled to the VSS pad 52<0> with the same interconnect 54 intervening therebetween. The ground voltage input terminals of the inverters IV8 to IV10 may be coupled to the VSS pad 52<0> with the different interconnects 54 respectively intervening therebetween.

Power supply voltage input terminals of the inverters IV11 to IV13 are coupled independently of each other to the interconnect 53a coupled to the VCCQ pad 51<0>, with the different interconnects 53b respectively intervening between the power supply voltage input terminals and the interconnect 53a. The power supply voltage input terminals of the inverters IV11 to IV13 may be coupled to the interconnect 53a with the same interconnect 53b intervening therebetween.

Ground voltage input terminals of the inverters IV11 to IV13 are coupled to the VSS pad 52<0> with the same interconnect 54 intervening therebetween. The ground voltage input terminals of the inverters IV11 to IV13 may be coupled to the VSS pad 52<0> with the different interconnects 54 respectively intervening therebetween.

Power supply voltage input terminals of the NAND circuits ND1 and ND2 are coupled independently of each other to the interconnect 53a coupled to the VCCQ pad 51<0>, with the different interconnects 53b respectively intervening between the power supply voltage input terminals and the interconnect 53a. The power supply voltage input terminals of the NAND circuits ND1 and ND2 may be coupled to the interconnect 53a with the same interconnect 53b intervening therebetween.

Ground voltage input terminals of the NAND circuits ND1 and ND2 are coupled to the VSS pad 52<0> with the same interconnect 54 intervening therebetween. The ground voltage input terminals of the NAND circuits ND1 and ND2 may be coupled to the VSS pad 52<0> with the different interconnects 54 respectively intervening therebetween.

Power supply voltage input terminals of the NAND circuits ND3 and ND4 are coupled independently of each other to the interconnect 53a coupled to the VCCQ pad 51<0>, with the different interconnects 53b respectively intervening between the power supply voltage input terminals and the interconnect 53a. The power supply voltage input terminals of the NAND circuits ND3 and ND4 may be coupled to the interconnect 53a with the same interconnect 53b intervening therebetween.

Ground voltage input terminals of the NAND circuits ND3 and ND4 are coupled to the VSS pad 52<0> with the same interconnect 54 intervening therebetween. The ground voltage input terminals of the NAND circuits ND3 and ND4 may be coupled to the VSS pad 52<0> with the different interconnects 54 respectively intervening therebetween.

A power supply voltage input terminal of the inverter IV14 is coupled to the interconnect 53a coupled to the VCCQ pad 51<0>, with the interconnect 53b respectively intervening between the power supply voltage input terminal and the interconnect 53a. A ground voltage input terminal of the inverter IV14 is coupled to the VSS pad 52<0> with the interconnect 54 intervening therebetween.

A power supply voltage input terminal of the inverter IV15 is coupled to the interconnect 53a coupled to the VCCQ pad 51<0>, with the interconnect 53b intervening between the power supply voltage input terminal and the interconnect 53a. A ground voltage input terminal of the inverter IV15 is coupled to the VSS pad 52<0> with the interconnect 54 intervening therebetween.

2.3 Advantageous Effects

With the configuration according to the present embodiment, the respective circuit units are coupled to the VSS pad 52<0> with the different interconnects 54 respectively intervening therebetween. Therefore, as with the first embodiment, the respective circuit units can prevent fluctuations in ground voltage, thereby being able to prevent a delay in circuit operation. This can prevent a deviation in timing of outputting a signal in output circuits 10b, thereby achieving an improvement in operation reliability.

3. Third Embodiment

A semiconductor memory device according to a third embodiment will be described. The semiconductor memory device according to the present embodiment differs from that of the first embodiment in that the respective circuit units of the output circuit 10b are coupled to the VSS pad 52 with the different interconnects 54 respectively intervening therebetween. The following description will in principle concentrate on the features different from the first embodiment.

3.1 Configuration of Input/Output Circuit 10

Figure 10:
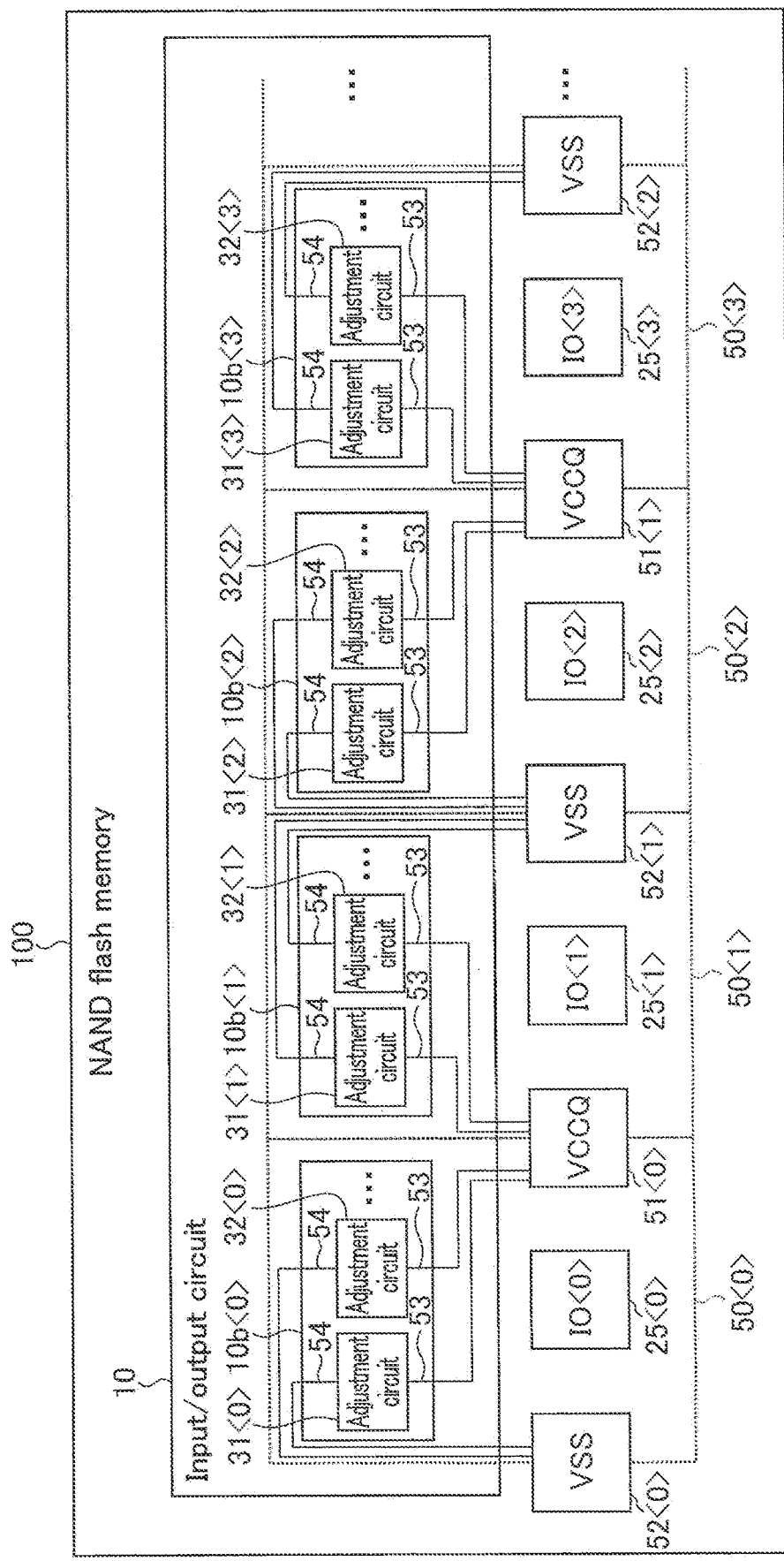
FIG. 10 is a block diagram of an input/output circuit included in a semiconductor memory device according to a third embodiment.

A configuration of the input/output circuit 10 included in the NAND flash memory 100 according to the present embodiment will be described with reference to FIG. 10. FIG. 10 is a block diagram showing the input/output circuit 10 included in the NAND flash memory 100 according to the present embodiment. The input/output circuit 10 shown in FIG. 10 omits the input circuits 10a<0> to 10a<7>. To simplify the description, with respect to the circuit units in each output circuit 10b, FIG. 10 illustrates the adjustment circuits 31 and 32 and omits the other circuit units. In FIG. 10, the IO circuit areas 50<4> to 50<7> are omitted. Since the IO circuit areas 50<0> to 50<3> have the same configuration as that of the IO circuit areas 50<4> to 50<7>, the IO circuits 50<0> to 50<3> will be described hereinafter.

As shown in FIG. 10, the IO circuit area 50<0> includes the output circuit 10b<0>, the IO pad 25<0>, the VCCQ pad 51<0>, the VSS pad 52<0>, the plurality of interconnects 53, and the plurality of interconnects 54.

In the IO circuit area 50<0>, the respective circuit units (the adjustment circuit 31<0>, the adjustment circuit 32<0>, ... ) within the output circuit 10b<0> are coupled independently of each other to the VCCQ pad 51<0> with the interconnects 53 respectively intervening therebetween.

Furthermore, in the IO circuit area 50<0>, the respective circuit units within the output circuit 10b<0> are coupled independently of each other to the VSS pad 52<0> with the interconnects 54 respectively intervening therebetween.

The IO circuit area 50<1> includes the output circuit 10b<1>, the IO pad 25<1>, the VCCQ pad 51<0>, the VSS pad 52<1>, the plurality of interconnects 53, and the plurality of interconnects 54.

In the IO circuit area 50<1>, the respective circuit units within the output circuit 10b<1> are coupled independently of each other to the VCCQ pad 51<0> with the interconnects 53 respectively intervening therebetween.

Furthermore, in the IO circuit area 50<1>, the respective circuit units within the output circuit 10b<1> are coupled independently of each other to the VSS pad 52<1> with the interconnects 54 respectively intervening therebetween.

The IO circuit area 50<2> includes the output circuit 10b<2>, the IO pad 25<2>, the VCCQ pad 51<1>, the VSS pad 52<1>, the plurality of interconnects 53, and the plurality of interconnects 54.

In the IO circuit area 50<2>, the respective circuit units within the output circuit 10b<2> are coupled independently of each other to the VCCQ pad 51<1> with the interconnects 53 respectively intervening therebetween.

Furthermore, in the IO circuit area 50<2>, the respective circuit units within the output circuit 10b<2> are coupled independently of each other to the VSS pad 52<1> with the interconnects 54 respectively intervening therebetween.

The IO circuit area 50<3> includes the output circuit 10b<3>, the IO pad 25<3>, the VCCQ pad 51<1>, the VSS pad 52<2>, the plurality of interconnects 53, and the plurality of interconnects 54.

In the IO circuit area 50<3>, the respective circuit units within the output circuit 10b<3> are coupled independently of each other to the VCCQ pad 51<1> with the interconnects 53 respectively intervening therebetween.

Furthermore, in the IO circuit area 50<3>, the respective circuit units within the output circuit 10b<3> are coupled independently of each other to the VSS pad 52<2> with the interconnects 54 respectively intervening therebetween.

3.2 Configuration of Output Circuit 10b

Figure 11:
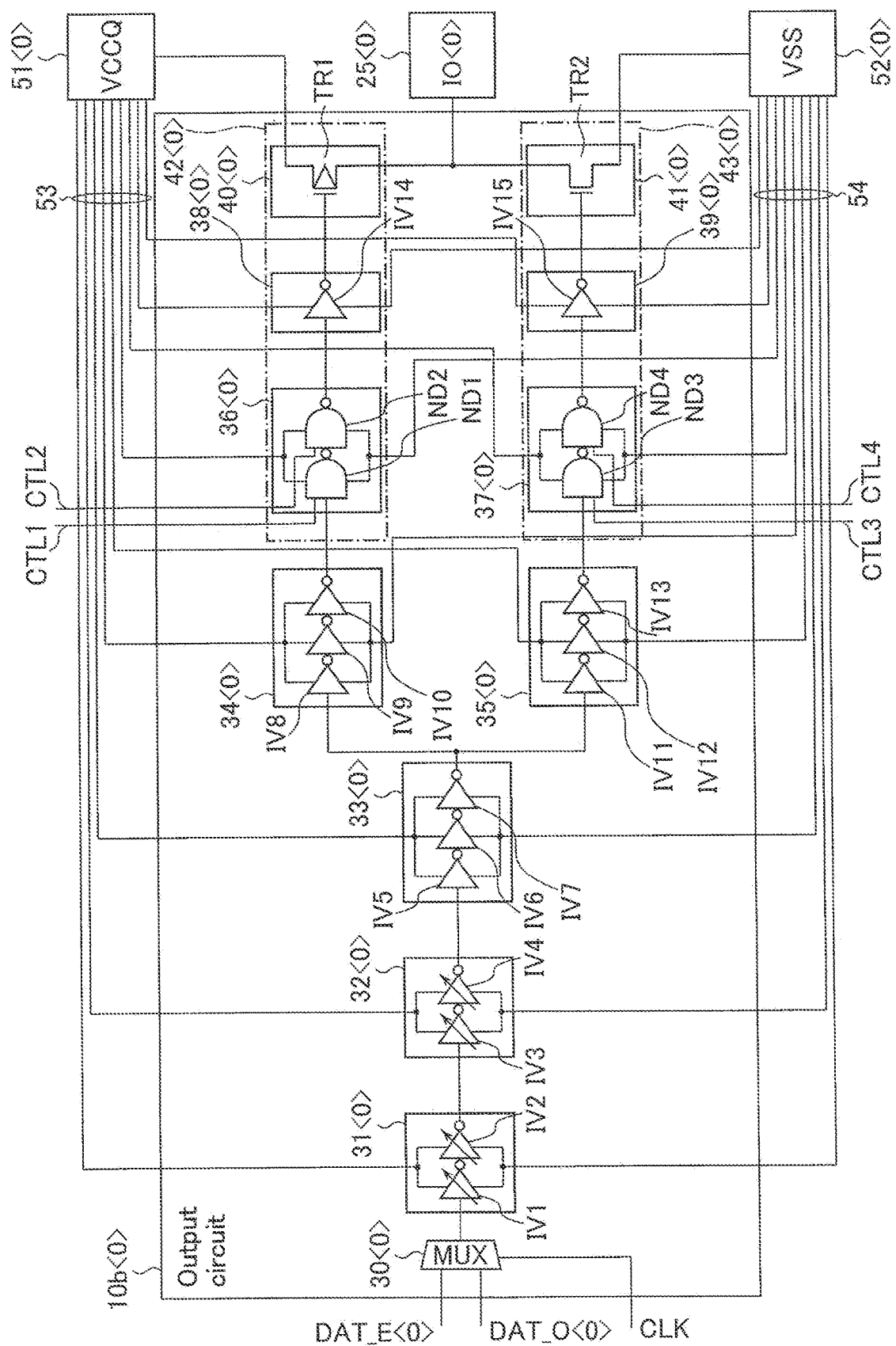
FIG. 11 is a circuit diagram showing one example of an output circuit included in the semiconductor memory device according to the third embodiment.

Next, a circuit configuration of the output circuit 10b included in the NAND flash memory 100 according to the present embodiment will be described with reference to FIG. 11. FIG. 11 is a circuit diagram showing one example of the output circuit 10b included in the NAND flash memory 100 according to the present embodiment. Since the output circuits 10b<0> to 10b<7> have the same configuration, details of respective circuit units within the output circuit 10b<0> will be described hereinafter.

As shown in FIG. 11, power supply voltage input terminals of the inverters IV1 and IV2 are coupled to the VCCQ pad 51<0> with the same interconnect 53 intervening therebetween. The power supply voltage input terminals of the inverters IV1 and IV2 may be coupled to the VCCQ pad 51<0> with the different interconnects 53 respectively intervening therebetween.

Ground voltage input terminals of the inverters IV1 and IV2 are coupled to the VSS pad 52<0> with the same interconnect 54 intervening therebetween. The ground voltage input terminals of the inverters IV1 and IV2 may be coupled to the VSS pad 52<0> with the different interconnects 54 respectively intervening therebetween.

The power supply voltage input terminals of the inverters IV3 and IV4 are coupled to the VCCQ pad 51<0> with the same interconnect 53 intervening therebetween. The power supply voltage input terminals of the inverters IV3 and IV4 may be coupled to the VCCQ pad 51<0> with the different interconnects 53 respectively intervening therebetween.

Ground voltage input terminals of the inverters IV3 and IV4 are coupled to the VSS pad 52<0> with the same interconnect 54 intervening therebetween. The ground voltage input terminals of the inverters IV3 and IV4 may be coupled to the VSS pad 52<0> with the different interconnects 54 respectively intervening therebetween.

Power supply voltage input terminals of the inverters IV5 to IV7 are coupled to the VCCQ pad 51<0> with the same interconnect 53 intervening therebetween. The power supply voltage input terminals of the inverters IV5 to IV7 may be coupled to the VCCQ pad 51<0> with the different interconnects 53 respectively intervening therebetween.

Ground voltage input terminals of the inverters IV5 to IV7 are coupled to the VSS pad 52<0> with the same interconnect 54 intervening therebetween. The ground voltage input terminals of the inverters IV5 to IV7 may be coupled to the VSS pad 52<0> with the different interconnects 54 respectively intervening therebetween.

Power supply voltage input terminals of the inverters IV8 to IV10 are coupled to the VCCQ pad 51<0> with the same interconnect 53 intervening therebetween. The power supply voltage input terminals of the inverters IV8 to IV10 may be coupled to the VCCQ pad 51<0> with the different interconnects 53 respectively intervening therebetween.

Ground voltage input terminals of the inverters IV8 to IV10 are coupled to the VSS pad 52<0> with the same interconnect 54 intervening therebetween. The ground voltage input terminals of the inverters IV8 to IV10 may be coupled to the VSS pad 52<0> with the different interconnects 54 respectively intervening therebetween.

Power supply voltage input terminals of the inverters IV11 to IV13 are coupled to the VCCQ pad 51<0> with the same interconnect 53 intervening therebetween. The power supply voltage input terminals of the inverters IV11 to IV13 may be coupled to the VCCQ pad 51<0> with the different interconnects 53 respectively intervening therebetween.

Ground voltage input terminals of the inverters IV11 to IV13 are coupled to the VSS pad 52<0> with the same interconnect 54 intervening therebetween. The ground voltage input terminals of the inverters IV11 to IV13 may be coupled to the VSS pad 52<0> with the different interconnects 54 respectively intervening therebetween.

Power supply voltage input terminals of the NAND circuits ND1 and ND2 are coupled to the VCCQ pad 51<0> with the same interconnect 53 intervening therebetween. The power supply voltage input terminals of the NAND circuits ND1 and ND2 may be coupled to the VCCQ pad 51<0> with the different interconnects 53 respectively intervening therebetween.

Ground voltage input terminals of the NAND circuits ND1 and ND2 are coupled to the VSS pad 52<0> with the same interconnect 54 intervening therebetween. The ground voltage input terminals of the NAND circuits ND1 and ND2 may be coupled to the VSS pad 52<0> with the different interconnects 54 respectively intervening therebetween.

Power supply voltage input terminals of the NAND circuits ND3 and ND4 are coupled to the VCCQ pad 51<0> with the same interconnect 53 intervening therebetween. The power supply voltage input terminals of the NAND circuits ND3 and ND4 may be coupled to the VCCQ pad 51<0> with the different interconnects 53 respectively intervening therebetween.

Ground voltage input terminals of the NAND circuits ND3 and ND4 are coupled to the VSS pad 52<0> with the same interconnect 54 intervening therebetween. The ground voltage input terminals of the NAND circuits ND3 and ND4 may be coupled to the VSS pad 52<0> with the different interconnects 54 respectively intervening therebetween.

A power supply voltage input terminal of the inverter IV14 is coupled to the VCCQ pad 51<0> with the interconnect 53 intervening therebetween. A ground voltage input terminal of the inverter IV14 is coupled to the VSS pad 52<0> with the interconnect 54 intervening therebetween.

A power supply voltage input terminal of the inverter IV15 is coupled to the VCCQ pad 51<0> with the interconnect 53 intervening therebetween. A ground voltage input terminal of the inverter IV15 is coupled to the VSS pad 52<0> with the interconnect 54 intervening therebetween.

3.3 Advantageous Effects

With the configuration according to the present embodiment, the respective circuit units are coupled to the VCCQ pad 51<0> via the different interconnects 53, respectively, and are coupled to the VSS pad 52<0> with the different interconnects 54 intervening therebetween. Therefore, the respective circuit units can prevent an increase in voltage drop and fluctuations in ground voltage, thereby being able to prevent a delay in circuit operation. This can prevent a deviation in timing of outputting a signal in output circuits 10b, thereby achieving an improvement in operation reliability.

4. Fourth Embodiment

A semiconductor memory device according to a fourth embodiment will be described. The semiconductor memory device according to the present embodiment differs from that of the first embodiment in that the respective circuit units of the output circuit 10b are coupled independently of each other to the interconnect 53a coupled to the VCCQ pad 51, with the different interconnects 53b respectively intervening between the circuit units and the interconnect 53a, and are coupled independently of each other to the interconnect 54a coupled to the VSS pad 52, with the different interconnects 54b and transistors 55 respectively intervening between the circuit units and the interconnect 54a. The following description will in principle concentrate on the features different from the first embodiment.

4.1 Configuration of Input/Output Circuit 10

Figure 12:
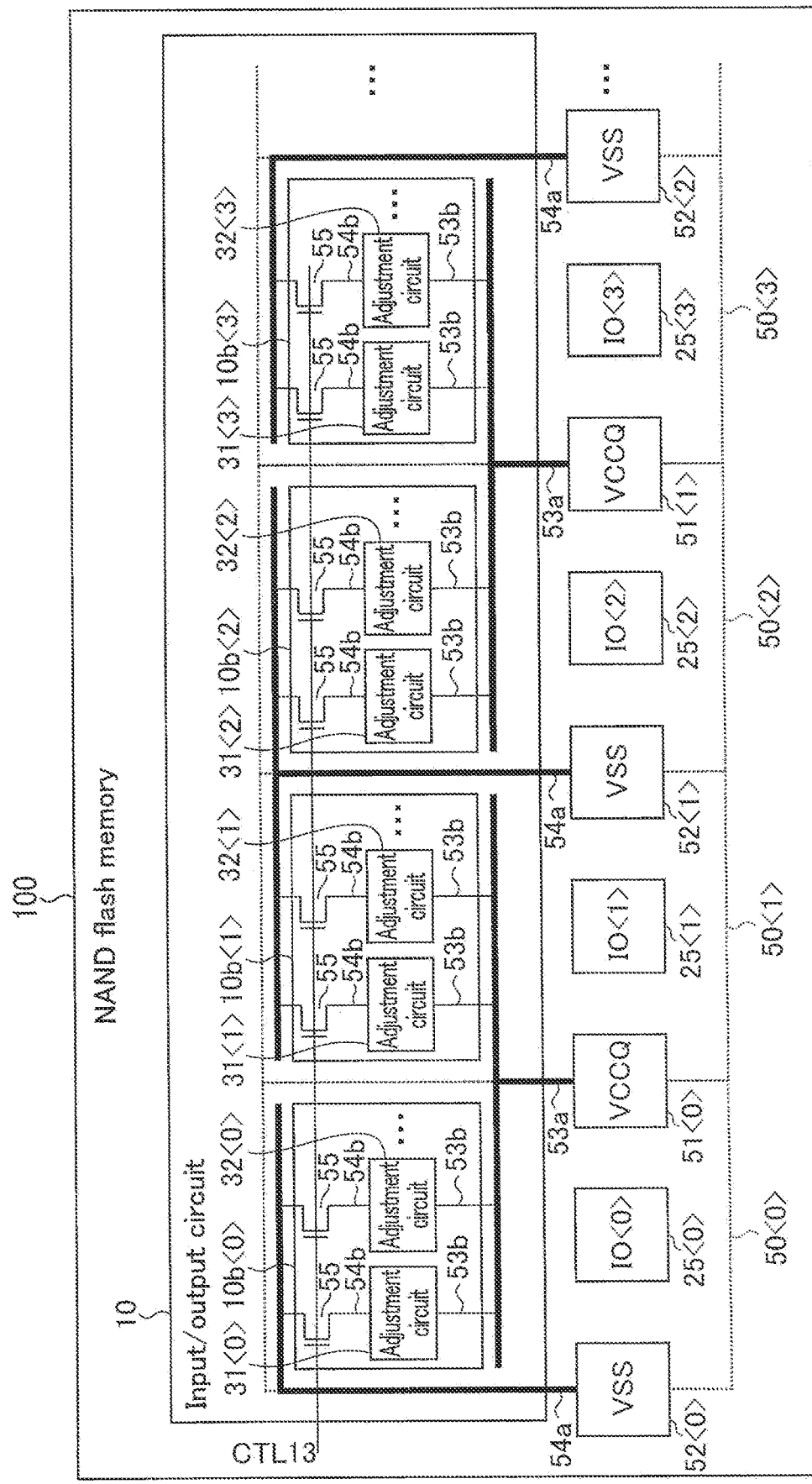
FIG. 12 is a block diagram of an input/output circuit included in a semiconductor memory device according to a fourth embodiment.

A configuration of the input/output circuit 10 included in the NAND flash memory 100 according to the present embodiment will be described with reference to FIG. 12. FIG. 12 is a block diagram showing the input/output circuit 10 included in the NAND flash memory 100 according to the present embodiment. The input/output circuit 10 shown in FIG. 12 omits the input circuits 10a<0> to 10a<7>. To simplify the description, with respect to the circuit units in each output circuit 10b, FIG. 12 illustrates the adjustment circuits 31 and 32 and omits the other circuit units. In FIG. 12, the IO circuit areas 50<4> to 50<7> are omitted. Since the IO circuit areas 50<0> to 50<3> have the same configuration as that of the IO circuit areas 50<4> to 50<7>, the IO circuits 50<0> to 50<3> will be described hereinafter.

As shown in FIG. 12, the IO circuit area 50<0> includes the output circuit 10b<0>, the IO pad 25<0>, the VCCQ pad 51<0>, the VSS pad 52<0>, the interconnect 53a, the plurality of interconnects 53b, the interconnect 54a, the plurality of interconnects 54b, and the plurality of n-channel MOS transistors 55.

A control signal CTL13 from the logic controller 12 is input to each of the gates of the plurality of transistors 55. The control signal CTL13 is a signal predicated on the signal CEn. The first end of each of the transistors 55 is coupled to the interconnect 54a. The second ends of the transistors 55 are respectively coupled to the interconnects 54b. The plurality of transistors 55 are provided in such a manner that at least one transistor 55 is provided for each circuit unit that completes an operation within one cycle (shortest cycle) of the clock signal CLK. For example, the plurality of transistors 55 may be provided in such a manner that one transistor 55 is provided for each of the adjustment circuit 31<0>, the adjustment circuit 32<0>, . . . , the driver 38<0>, and the driver 39<0>. In the IO circuit areas 50<1> to 50<7> also, the plurality of transistors 55 are provided in a similar manner to the IO circuit area 50<0>.

In the IO circuit area 50<0>, the interconnect 53*a* is coupled to the VCCQ pad 51<0>. Each of the circuit units (the adjustment circuit 31<0>, the adjustment circuit 32<0>, . . . ) within the output circuit 10*b*<0> is coupled to the interconnect 53*a* coupled to the VCCQ pad 51<0>, with the interconnect 53*b* intervening between each of the circuit units and the interconnect 53*a*.

In the IO circuit area 50<0>, the interconnect 54*a* is coupled to the VSS pad 52<0>. Each of the circuit units within the output circuit 10*b*<0> is coupled to the interconnect 54*a* coupled to the VSS pad 52<0>, with the interconnect 54*b* and the transistor 55 intervening between each of the circuit units and the interconnect 54*a*.

The IO circuit area 50<1> includes the output circuit 10*b*<1>, the IO pad 25<1>, the VCCQ pad 51<0>, the VSS pad 52<1>, the interconnect 53*a*, the plurality of interconnects 53*b*, the interconnect 54*a*, the plurality of interconnects 54*b*, and the plurality of n-channel MOS transistors 55.

In the IO circuit area 50<1>, the interconnect 53*a* is coupled to the VCCQ pad 51<0>. Each of the circuit units within the output circuit 10*b*<1> is coupled to the interconnect 53*a* coupled to the VCCQ pad 51<0>, with the interconnect 53*b* intervening between each of the circuit units and the interconnect 53*a*.

In the IO circuit area 50<1>, the interconnect 54*a* is coupled to the VSS pad 52<1>. Each of the circuit units within the output circuit 10*b*<1> is coupled to the interconnect 54*a* coupled to the VSS pad 52<1>, with the interconnect 54*b* and the transistor 55 intervening between each of the circuit units and the interconnect 54*a*.

The IO circuit area 50<2> includes the output circuit 10*b*<2>, the IO pad 25<2>, the VCCQ pad 51<1>, the VSS pad 52<1>, the interconnect 53*a*, the plurality of interconnects 53*b*, the interconnect 54*a*, the plurality of interconnects 54*b*, and the plurality of n-channel MOS transistors 55.

In the IO circuit area 50<2>, the interconnect 53*a* is coupled to the VCCQ pad 51<1>. Each of the circuit units within the output circuit 10*b*<2> is coupled to the interconnect 53*a* coupled to the VCCQ pad 51<1>, with the interconnect 53*b* intervening between each of the circuit units and the interconnect 53*a*.

In the IO circuit area 50<2>, the interconnect 54*a* is coupled to the VSS pad 52<1>. Each of the circuit units within the output circuit 10*b*<2> is coupled to the interconnect 54*a* coupled to the VSS pad 52<1>, with the interconnect 54*b* and the transistor 55 intervening between each of the circuit units and the interconnect 54*a*.

The IO circuit area 50<3> includes the output circuit 10*b*<3>, the IO pad 25<3>, the VCCQ pad 51<1>, the VSS pad 52<2>, the interconnect 53*a*, the plurality of interconnects 53*b*, the interconnect 54*a*, the plurality of interconnects 54*b*, and the plurality of n-channel MOS transistors 55.

In the IO circuit area 50<3>, the interconnect 53*a* is coupled to the VCCQ pad 51<1>. Each of the circuit units within the output circuit 10*b*<3> is coupled to the interconnect 53*a* coupled to the VCCQ pad 51<1>, with the interconnect 53*b* intervening between each of the circuit units and the interconnect 53*a*.

In the IO circuit area 50<3>, the interconnect 54*a* is coupled to the VSS pad 52<2>. Each of the circuit units within the output circuit 10*b*<3> is coupled to the interconnect 54*a* coupled to the VSS pad 52<2>, with the interconnect 54*b* and the transistor 55 intervening between each of the circuit units and the interconnect 54*a*.

4.2 Configuration of Output Circuit 10*b*

Next, a circuit configuration of the output circuit 10*b* included in the NAND flash memory 100 according to the present embodiment will be described with reference to FIG. 13. FIG. 13 is a circuit diagram showing one example of the output circuit 10*b* included in the NAND flash memory 100 according to the present embodiment. Since the output circuits 10*b*<0> to 10*b*<7> have the same configuration, details of respective circuit units within the output circuit 10*b*<0> will be described hereinafter.

According to the present embodiment, the plurality of transistors 55 are provided in such a manner that one or more transistors 55 are provided for each of the adjustment circuit 31<0>, the adjustment circuit 32<0>, . . . , the driver 38<0>, and the driver 39<0>, in particular, one transistor 55 is provided for each odd-numbered inverter and each odd-numbered NAND circuit.

As shown in FIG. 13, power supply voltage input terminals of the inverters IV1 and IV2 are coupled independently of each other to the interconnect 53*a* coupled to the VCCQ pad 51<0>, with the different interconnects 53*b* respectively intervening between the power supply voltage input terminals and the interconnect 53*a*. The power supply voltage input terminals of the inverters IV1 and IV2 may be coupled to the interconnect 53*a* with the same interconnect 53*b* intervening therebetween.

Ground voltage input terminals of the inverters IV1 and IV2 are coupled independently of each other to the interconnect 54*a* coupled to the VSS pad 52<0>, with the different interconnects 54*b* and transistors 55 (55A and 55B) respectively intervening between the ground voltage input terminals and the interconnect 54*a*.

Power supply voltage input terminals of the inverters IV3 and IV4 are coupled independently of each other to the interconnect 53*a* coupled to the VCCQ pad 51<0>, with the different interconnects 53*b* respectively intervening between the power supply voltage input terminals and the interconnect 53*a*. The power supply voltage input terminals of the inverters IV3 and IV4 may be coupled to the interconnect 53*a* with the same interconnect 53*b* intervening therebetween.

Ground voltage input terminals of the inverters IV3 and IV4 are coupled independently of each other to the interconnect 54*a* coupled to the VSS pad 52<0>, with the different interconnects 54*b* and transistors 55 (55C and 55D) respectively intervening between the ground voltage input terminals and the interconnect 54*a*.

Power supply voltage input terminals of the inverters IV5 to IV7 are coupled independently of each other to the interconnect 53*a* coupled to the VCCQ pad 51<0>, with the different interconnects 53*b* respectively intervening between the power supply voltage input terminals and the interconnect 53*a*. The power supply voltage input terminals of the inverters IV5 to IV7 may be coupled to the interconnect 53*a* with the same interconnect 53*b* intervening therebetween.

Ground voltage input terminals of the inverters IV5 to IV7 are coupled to the interconnect 54*a* coupled to the VSS pad 52<0>, with the interconnect 54*b* and the transistor 55E intervening between the ground voltage input terminals and the interconnect 54*a*.

Power supply voltage input terminals of the inverters IV8 to IV10 are coupled independently of each other to the interconnect 53*a* coupled to the VCCQ pad 51<0>, with the different interconnects 53*b* respectively intervening between the power supply voltage input terminals and the interconnect 53*a*. The power supply voltage input terminals of the inverters IV8 to IV10 may be coupled to the interconnect 53*a* with the same interconnect 53*b* intervening therebetween.

Ground voltage input terminals of the inverters IV8 to IV10 are coupled to the interconnect 54a coupled to the VSS pad 52<0>, with the interconnect 54b and the transistor 55F intervening between the ground voltage input terminals and the interconnect 54a.

Power supply voltage input terminals of the inverters IV11 to IV13 are coupled independently of each other to the interconnect 53a coupled to the VCCQ pad 51<0>, with the different interconnects 53b respectively intervening between the power supply voltage input terminals and the interconnect 53a. The power supply voltage input terminals of the inverters IV11 to IV13 may be coupled to the interconnect 53a with the same interconnect 53b intervening therebetween.

Ground voltage input terminals of the inverters IV11 to IV13 are coupled to the interconnect 54a coupled to the VSS pad 52<0>, with the interconnect 54b and the transistor 55G intervening between the ground voltage input terminals and the interconnect 54a.

Power supply voltage input terminals of the NAND circuits ND1 and ND2 are coupled independently of each other to the interconnect 53a coupled to the VCCQ pad 51<0>, with the different interconnects 53b respectively intervening between the power supply voltage input terminals and the interconnect 53a. The power supply voltage input terminals of the NAND circuits ND1 and ND2 may be coupled to the interconnect 53a with the same interconnect 53b intervening therebetween.

Ground voltage input terminals of the NAND circuits ND1 and ND2 are coupled independently of each other to the interconnect 54a coupled to the VSS pad 52<0>, with the different interconnects 54b and transistors 55 (55H and 55I) respectively intervening between the ground voltage input terminals and the interconnect 54a.

Power supply voltage input terminals of the NAND circuits ND3 and ND4 are coupled independently of each other to the interconnect 53a coupled to the VCCQ pad 51<0>, with the different interconnects 53b respectively intervening between the power supply voltage input terminals and the interconnect 53a. The power supply voltage input terminals of the NAND circuits ND3 and ND4 may be coupled to the interconnect 53a with the same interconnect 53b intervening therebetween.

Ground voltage input terminals of the NAND circuits ND3 and ND4 are coupled independently of each other to the interconnect 54a coupled to the VSS pad 52<0>, with the different interconnects 54b and transistors 55 (55J and 55K) respectively intervening between the ground voltage input terminals and the interconnect 54a.

A power supply voltage input terminal of the inverter IV14 is coupled to the interconnect 53a coupled to the VCCQ pad 51<0>, with the interconnect 53b intervening between the power supply voltage input terminal and the interconnect 53a. A ground voltage input terminal of the inverter IV14 is coupled to the interconnect 54a coupled to the VSS pad 52<0>, with the interconnect 54b and the transistor 55L intervening between the ground voltage input terminal and the interconnect 54a.

A power supply voltage input terminal of the inverter IV15 is coupled to the interconnect 53a coupled to the VCCQ pad 51<0>, with the interconnect 53b intervening between the power supply voltage input terminal and the interconnect 53a. A ground voltage input terminal of the inverter IV15 is coupled to the interconnect 54a coupled to the VSS pad 52<0>, with the interconnect 54b and the transistor 55M intervening between the ground voltage input terminal and the interconnect 54a.

4.3 Advantageous Effects

With the configuration according to the present embodiment, the respective circuit units are coupled independently of each other to the interconnect 54a coupled to the VSS pad 52, with the different interconnects 54b and transistors 55 respectively intervening between the respective circuit units and the interconnect 54a. Therefore, when the transistor 55 is turned on (when the power supply is turned on), as with the second embodiment, the respective circuit units can prevent fluctuations in ground voltage, thereby being able to prevent a delay in circuit operation. This can prevent a deviation in timing of outputting a signal in output circuits 10b, thereby achieving an improvement in operation reliability.

Furthermore, the configuration according to the present embodiment can reduce a leakage current flowing through the respective circuit units when the transistor 55 is turned off (during low power operation (standby)).

5. Fifth Embodiment

A semiconductor memory device according to a fifth embodiment will be described. The semiconductor memory device according to the present embodiment differs from that of the fourth embodiment in that the respective circuit units of the output circuit 10b are coupled independently of each other to the interconnect 53a coupled to the VCCQ pad 51, with the different interconnects 53b and transistors 56 respectively intervening between the circuit units and the interconnect 53a, and are coupled independently of each other to the interconnect 54a coupled to the VSS pad 52, with the different interconnects 54b respectively intervening between the circuit units and the interconnect 54a. The following description will in principle concentrate on the features different from the fourth embodiment.

5.1 Configuration of Input/Output Circuit 10

A configuration of the input/output circuit 10 included in the NAND flash memory 100 according to the present embodiment will be described with reference to FIG. 14. FIG. 14 is a block diagram showing the input/output circuit 10 included in the NAND flash memory 100 according to the present embodiment. The input/output circuit 10 shown in FIG. 14 omits the input circuits 10a<0> to 10a<7>. To simplify the description, with respect to the circuit units in each output circuit 10b, FIG. 14 illustrates the adjustment circuits 31 and 32 and omits the other circuit units. In FIG. 14, the IO circuit areas 50<4> to 50<7> are omitted. Since the IO circuit areas 50<0> to 50<3> have the same configuration as that of the IO circuit areas 50<4> to 50<7>, the IO circuits 50<0> to 50<3> will be described hereinafter.

As shown in FIG. 14, the IO circuit area 50<0> includes the output circuit 10b<0>, the IO pad 25<0>, the VCCQ pad 51<0>, the VSS pad 52<0>, the interconnect 53a, the plurality of interconnects 53b, the interconnect 54a, the plurality of interconnects 54b, and the plurality of p-channel MOS transistors 56.

A control signal CTL14 from the logic controller 12 is input to each of the gates of the plurality of transistors 56. The control signal CTL14 is a signal predicated on the signal CEn. One end of each of the transistors 56 is coupled to the interconnect 53a. The second ends of the transistors 56 are respectively coupled to the interconnects 53b. The plurality of transistors 56 are provided in such a manner that at least one transistor 56 is provided for each circuit unit that completes an operation within one cycle (shortest cycle) of the clock signal CLK. For example, the plurality of transistors 56 may be provided in such a manner that one transistor 56 is provided for each of the adjustment circuit 31<0>, the adjustment circuit 32<0>, . . . , the driver 38<0>, and the driver 39<0>. In the IO circuit areas 50<1> to 50<7> also, the plurality of transistors 56 are provided in a similar manner to the IO circuit area 50<0>.

In the IO circuit area 50<0>, the interconnect 53a is coupled to the VCCQ pad 51<0>. Each of the circuit units (the adjustment circuit 31<0>, the adjustment circuit 32<0>, . . . ) within the output circuit 10b<0> is coupled to the interconnect 53a coupled to the VCCQ pad 51<0>, with the interconnect 53b and the transistor 56 intervening between each of the circuit units and the interconnect 53a.

In the IO circuit area 50<0>, the interconnect 54a is coupled to the VSS pad 52<0>. Each of the circuit units within the output circuit 10b<0> is coupled to the interconnect 54a coupled to the VSS pad 52<0>, with the interconnect 54b intervening between each of the circuit units and the interconnect 54a.

The IO circuit area 50<1> includes the output circuit 10b<1>, the IO pad 25<1>, the VCCQ pad 51<0>, the VSS pad 52<1>, the interconnect 53a, the plurality of interconnects 53b, the interconnect 54a, the plurality of interconnects 54b, and the plurality of p-channel MOS transistors 56.

In the IO circuit area 50<1>, the interconnect 53a is coupled to the VCCQ pad 51<0>. Each of the circuit units within the output circuit 10b<1> is coupled to the interconnect 53a coupled to the VCCQ pad 51<0>, with the interconnect 53b and the transistor 56 intervening between each of the circuit units and the interconnect 53a.

In the IO circuit area 50<1>, the interconnect 54a is coupled to the VSS pad 52<1>. Each of the circuit units within the output circuit 10b<1> is coupled to the interconnect 54a coupled to the VSS pad 52<1>, with the interconnect 54b intervening between each of the circuit units and the interconnect 54a.

The IO circuit area 50<2> includes the output circuit 10b<2>, the IO pad 25<2>, the VCCQ pad 51<1>, the VSS pad 52<1>, the interconnect 53a, the plurality of interconnects 53b, the interconnect 54a, the plurality of interconnects 54b, and the plurality of p-channel MOS transistors 56.

In the IO circuit area 50<2>, the interconnect 53a is coupled to the VCCQ pad 51<1>. Each of the circuit units within the output circuit 10b<2> is coupled to the interconnect 53a coupled to the VCCQ pad 51<1>, with the interconnect 53b and the transistor 56 intervening between each of the circuit units and the interconnect 53a.

In the IO circuit area 50<2>, the interconnect 54a is coupled to the VSS pad 52<1>. Each of the circuit units within the output circuit 10b<2> is coupled to the interconnect 54a coupled to the VSS pad 52<1>, with the interconnect 54b intervening between each of the circuit units and the interconnect 54a.

The IO circuit area 50<3> includes the output circuit 10b<3>, the IO pad 25<3>, the VCCQ pad 51<1>, the VSS pad 52<2>, the interconnect 53a, the plurality of interconnects 53b, the interconnect 54a, the plurality of interconnects 54b, and the plurality of p-channel MOS transistors 56.

In the IO circuit area 50<3>, the interconnect 53a is coupled to the VCCQ pad 51<1>. Each of the circuit units within the output circuit 10b<3> is coupled to the interconnect 53a coupled to the VCCQ pad 51<1>, with the interconnect 53b and the transistor 56 intervening between each of the circuit units and the interconnect 53a.

In the IO circuit area 50<3>, the interconnect 54a is coupled to the VSS pad 52<2>. Each of the circuit units within the output circuit 10b<3> is coupled to the interconnect 54a coupled to the VSS pad 52<2>, with the interconnect 54b intervening between each of the circuit units and the interconnect 54a.

5.2 Configuration of Output Circuit 10b

Figure 15:
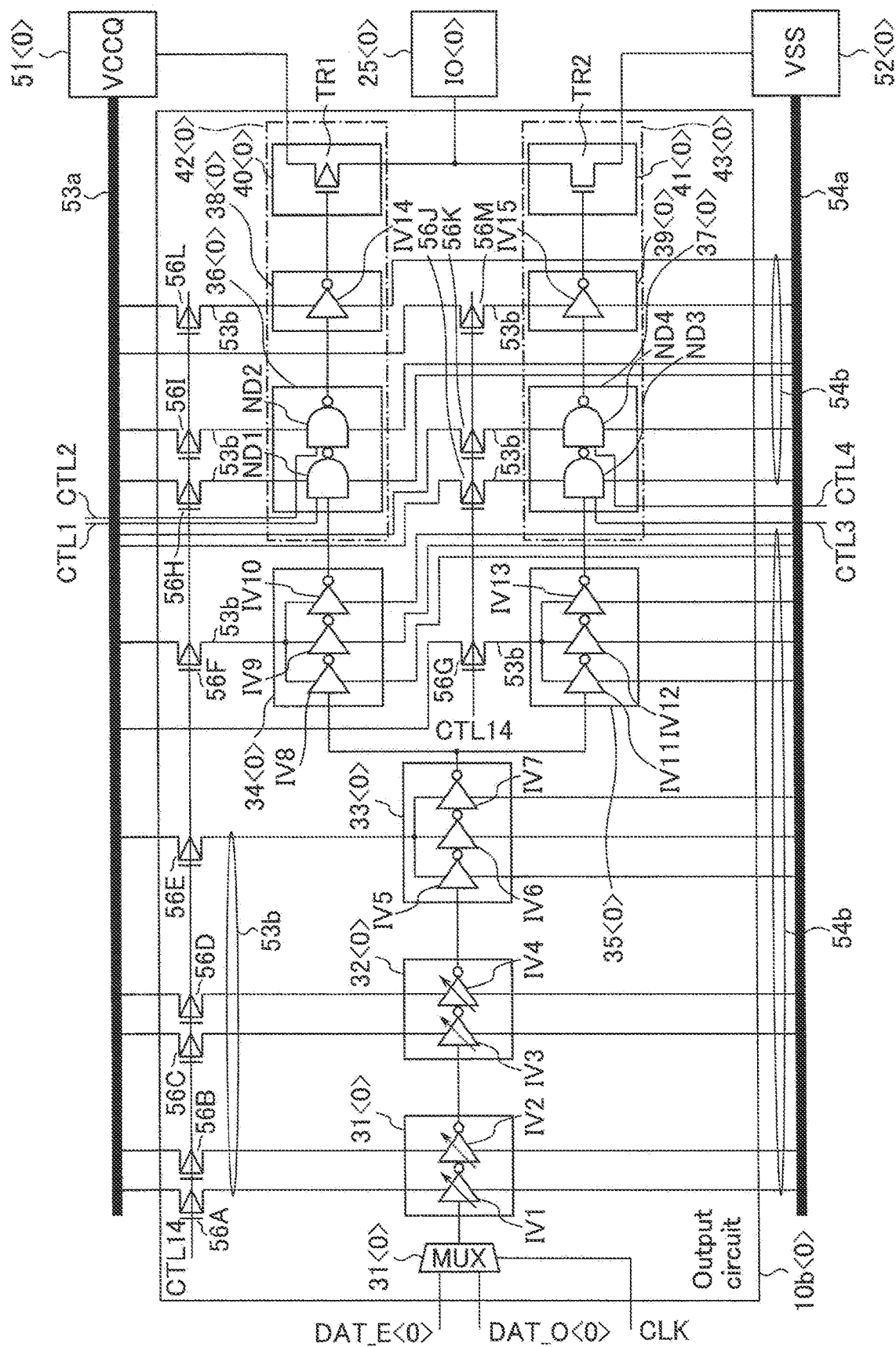
FIG. 15 is a circuit diagram showing one example of an output circuit included in the semiconductor memory device according to the fifth embodiment.

Next, a circuit configuration of the output circuit 10b included in the NAND flash memory 100 according to the present embodiment will be described with reference to FIG. 15. FIG. 15 is a circuit diagram showing one example of the output circuit 10b included in the NAND flash memory 100 according to the present embodiment. Since the output circuits 10b<0> to 10b<7> have the same configuration, details of respective circuit units within the output circuit 10b<0> will be described hereinafter.

According to the present embodiment, the plurality of transistors 56 are provided in such a manner that one or more transistors 56 are provided for each of the adjustment circuit 31<0>, the adjustment circuit 32<0>, . . . , the driver 38<0>, and the driver 39<0>, and in particular, one transistor 56 is provided for each odd-numbered inverter and each odd-numbered NAND circuit.

As shown in FIG. 15, power supply voltage input terminals of the inverters IV1 and IV2 are coupled independently of each other to the interconnect 53a coupled to the VCCQ pad 51<0>, with the different interconnects 53b and transistors 56 (56A and 56B) respectively intervening between the power supply voltage input terminals and the interconnect 53a.

Ground voltage input terminals of the inverters IV1 and IV2 are coupled independently of each other to the interconnect 54a coupled to the VSS pad 52<0>, with the different interconnects 54b respectively intervening between the ground voltage input terminals and the interconnect 54a. The ground voltage input terminals of the inverters IV1 and IV2 may be coupled to the interconnect 54a with the same interconnect 54b intervening therebetween.

Power supply voltage input terminals of the inverters IV3 and IV4 are coupled independently of each other to the interconnect 53a coupled to the VCCQ pad 51<0>, with the different interconnects 53b and transistors 56 (56C and 56D) respectively intervening between the power supply voltage input terminals and the interconnect 53a.

Ground voltage input terminals of the inverters IV3 and IV4 are coupled independently of each other to the interconnect 54a coupled to the VSS pad 52<0>, with the different interconnects 54b respectively intervening between the ground voltage input terminals and the interconnect 54a. The ground voltage input terminals of the inverters IV3 and IV4 may be coupled to the interconnect 54a with the same interconnect 54b intervening therebetween.

Power supply voltage input terminals of the inverters IV5 to IV7 are coupled to the interconnect 53a coupled to the VCCQ pad 51<0> with the interconnect 53b and the transistor 56E intervening between the power supply voltage input terminals and the interconnect 53a.

Ground voltage input terminals of the inverters IV5 to IV7 are coupled independently of each other to the interconnect 54a coupled to the VSS pad 52<0>, with the different interconnects 54b respectively intervening between the ground voltage input terminals and the interconnect 54a. The ground voltage input terminals of the inverters IV5 to IV7 may be coupled to the interconnect 54a with the same interconnect 54b intervening therebetween.

Power supply voltage input terminals of the inverters IV8 to IV10 are coupled to the interconnect 53a coupled to the VCCQ pad 51<0>, with the interconnect 53b and the transistor 56F intervening between the power supply voltage input terminals and the interconnect 53a.

Ground voltage input terminals of the inverters IV8 to IV10 are coupled independently of each other to the interconnect 54a coupled to the VSS pad 52<0>, with the different interconnects 54b respectively intervening between the ground voltage input terminals and the interconnect 54a. The ground voltage input terminals of the inverters IV8 to IV10 may be coupled to the interconnect 54a with the same interconnect 54b intervening therebetween.

Power supply voltage input terminals of the inverters IV11 to IV13 are coupled to the interconnect 53a coupled to the VCCQ pad 51<0>, with the interconnect 53b and the transistor 56G intervening between the power supply voltage input terminals and the interconnect 53a.

Ground voltage input terminals of the inverters IV11 to IV13 are coupled independently of each other to the interconnect 54a coupled to the VSS pad 52<0>, with the different interconnects 54b respectively intervening between the ground voltage input terminals and the interconnect 54a. The ground voltage input terminals of the inverters IV11 to IV13 may be coupled to the interconnect 54a with the same interconnect 54b intervening therebetween.

Power supply voltage input terminals of the NAND circuits ND1 and ND2 are coupled independently of each other to the interconnect 53a coupled to the VCCQ pad 51<0>, with the different interconnects 53b and transistors 56 (56H and 56I) respectively intervening between the power supply voltage input terminals and the interconnect 53a.

Ground voltage input terminals of the NAND circuits ND1 and ND2 are coupled independently of each other to the interconnect 54a coupled to the VSS pad 52<0>, with the different interconnects 54b respectively intervening between the ground voltage input terminals and the interconnect 54a. The ground voltage input terminals of the NAND circuits ND1 and ND2 may be coupled to the interconnect 54a with the same interconnect 54b intervening therebetween.

Power supply voltage input terminals of the NAND circuits ND3 and ND4 are coupled independently of each other to the interconnect 53a coupled to the VCCQ pad 51<0>, with the different interconnects 53b and transistors 56 (56J and 56K) respectively intervening between the power supply voltage input terminals and the interconnect 53a.

Ground voltage input terminals of the NAND circuits ND3 and ND4 are coupled independently of each other to the interconnect 54a coupled to the VSS pad 52<0>, with the different interconnects 54b respectively intervening between the ground voltage input terminals and the interconnect 54a. The ground voltage input terminals of the NAND circuits ND3 and ND4 may be coupled to the interconnect 54a with the same interconnect 54b intervening therebetween.

A power supply voltage input terminal of the inverter IV14 is coupled to the interconnect 53a coupled to the VCCQ pad 51<0>, with the interconnect 53b and the transistor 56L intervening between the power supply voltage input terminal and the interconnect 53a. A ground voltage input terminal of the inverter IV14 is coupled to the interconnect 54a coupled to the VSS pad 52<0>, with the interconnect 54b intervening between the ground voltage input terminal and the interconnect 54a.

A power supply voltage input terminal of the inverter IV15 is coupled to the interconnect 53a coupled to the VCCQ pad 51<0>, with the interconnect 53b and the transistor 56M intervening between the power supply voltage input terminal and the interconnect 53a. A ground voltage input terminal of the inverter IV15 is coupled to the interconnect 54a coupled to the VSS pad 52<0>, with the interconnect 54b intervening between the ground voltage input terminal and the interconnect 54a.

5.3 Advantageous Effects

With the configuration according to the present embodiment, the respective circuit units are coupled independently of each other via the different interconnects 53b and transistors 56, respectively, to the interconnect 53a coupled to the VCCQ pad 51. Therefore, when the transistor 56 is turned on (when the power supply is turned on), as with the first embodiment, the respective circuit units can prevent an increase in voltage drop, thereby being able to prevent a delay in circuit operation. This can prevent a deviation in timing of outputting a signal in output circuits 10b, thereby achieving an improvement in operation reliability.

Furthermore, the configuration according to the present embodiment can reduce a leakage current flowing through the respective circuit units when the transistor 56 is turned off (during low power operation (standby)).

6. Sixth Embodiment

A semiconductor memory device according to a sixth embodiment will be described. The semiconductor memory device according to the present embodiment differs from that of the fourth embodiment in that the respective circuit units of the output circuit 10b are coupled independently of each other to the interconnect 53a coupled to the VCCQ pad 51, with the different interconnects 53b and transistors 56 respectively intervening between the circuit units and the interconnect 53a, and are coupled independently of each other to the interconnect 54a coupled to the VSS pad 52, with the different interconnects 54b and transistors 55 respectively intervening between the circuit units and the interconnect 54a. The following description will in principle concentrate on the features different from the fourth embodiment.

6.1 Configuration of Input/Output Circuit 10

Figure 16:
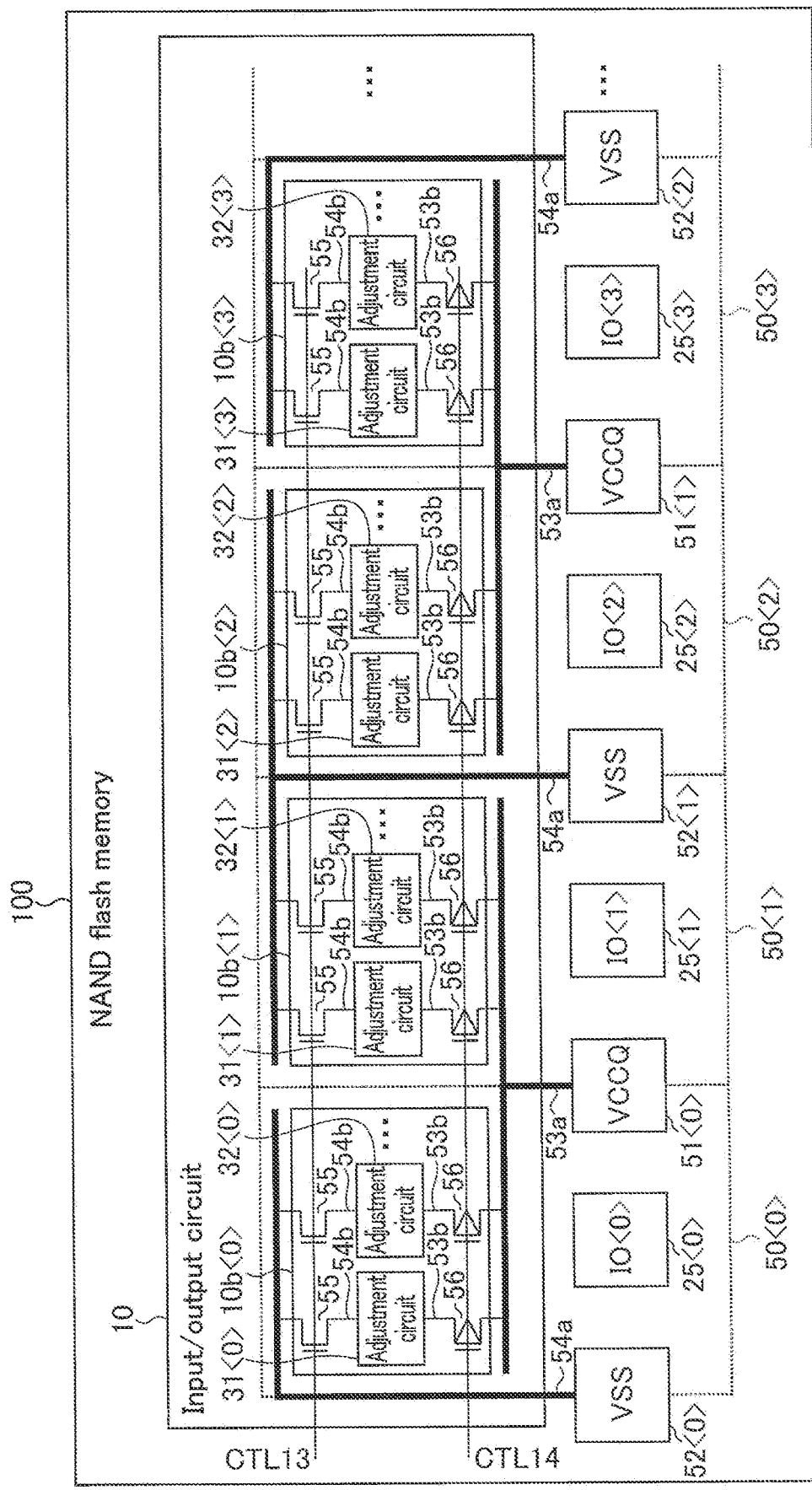
FIG. 16 is a block diagram of an input/output circuit included in a semiconductor memory device according to a sixth embodiment.

A configuration of the input/output circuit 10 included in the NAND flash memory 100 according to the present embodiment will be described with reference to FIG. 16. FIG. 16 is a block diagram showing the input/output circuit 10 included in the NAND flash memory 100 according to the present embodiment. The input/output circuit 10 shown in FIG. 16 omits the input circuits 10a<0> to 10a<7>. To simplify the description, with respect to the circuit units in each output circuit 10b, FIG. 16 illustrates the adjustment circuits 31 and 32 and omits the other circuit units. In FIG. 16, the IO circuit areas 50<4> to 50<7> are omitted. Since the IO circuit areas 50<0> to 50<3> have the same configuration as that of the IO circuit areas 50<4> to 50<7>, the IO circuits 50<0> to 50<3> will be described hereinafter.

As shown in FIG. 16, the IO circuit area 50<0> includes the output circuit 10b<0>, the IO pad 25<0>, the VCCQ pad 51<0>, the VSS pad 52<0>, the interconnect 53a, the plurality of interconnects 53b, the interconnect 54a, the plurality of interconnects 54b, the plurality of re-channel MOS transistors 55, and the plurality of p-channel MOS transistors 56.

In the IO circuit area 50<0>, the interconnect 53a is coupled to the VCCQ pad 51<0>. Each of the circuit units (the adjustment circuit 31<0>, the adjustment circuit 32<0>, . . . ) within the output circuit 10b<0> is coupled to the interconnect 53a coupled to the VCCQ pad 51<0>, with the interconnect 53b and the transistor 56 intervening between each of the circuit units and the interconnect 53a.

In the IO circuit area 50<0>, the interconnect 54a is coupled to the VSS pad 52<0>. Each of the circuit units within the output circuit 10b<0> is coupled to the interconnect 54a coupled to the VSS pad 52<0>, with the interconnect 54b and the transistor 55 intervening between each of the circuit units and the interconnect 54a. Each interconnect 54b provides coupling between the interconnect 54a and a single circuit unit with the transistor 55 intervening therebetween.

The IO circuit area 50<1> includes the output circuit 10b<1>, the IO pad 25<1>, the VCCQ pad 51<0>, the VSS pad 52<1>, the interconnect 53a, the plurality of interconnects 53b, the interconnect 54a, the plurality of interconnects 54b, the plurality of n-channel MOS transistors 55, and the plurality of p-channel MOS transistors 56.

In the IO circuit area 50<1>, the interconnect 53a is coupled to the VCCQ pad 51<0>. Each of the circuit units within the output circuit 10b<1> is coupled to the interconnect 53a coupled to the VCCQ pad 51<0>, with the interconnect 53b and the transistor 56 intervening between each of the circuit units and the interconnect 53a.

In the IO circuit area 50<1>, the interconnect 54a is coupled to the VSS pad 52<1>. Each of the circuit units within the output circuit 10b<1> is coupled to the interconnect 54a coupled to the VSS pad 52<1>, with the interconnect 54b and the transistor 55 intervening between each of the circuit units and the interconnect 54a.

The IO circuit area 50<2> includes the output circuit 10b<2>, the IO pad 25<2>, the VCCQ pad 51<1>, the VSS pad 52<1>, the interconnect 53a, the plurality of interconnects 53b, the interconnect 54a, the plurality of interconnects 54b, the plurality of n-channel MOS transistors 55, and the plurality of p-channel MOS transistors 56.

In the IO circuit area 50<2>, the interconnect 53a is coupled to the VCCQ pad 51<1>. Each of the circuit units within the output circuit 10b<2> is coupled to the interconnect 53a coupled to the VCCQ pad 51<1>, with the interconnect 53b and the transistor 56 intervening between each of the circuit units and the interconnect 53a.

In the IO circuit area 50<2>, the interconnect 54a is coupled to the VSS pad 52<1>. Each of the circuit units within the output circuit 10b<2> is coupled to the interconnect 54a coupled to the VSS pad 52<1>, with the interconnect 54b and the transistor 55 intervening between each of the circuit units and the interconnect 54a.

The IO circuit area 50<3> includes the output circuit 10b<3>, the IO pad 25<3>, the VCCQ pad 51<1>, the VSS pad 52<2>, the interconnect 53a, the plurality of interconnects 53b, the interconnect 54a, the plurality of interconnects 54b, the plurality of n-channel MOS transistors 55, and the plurality of p-channel MOS transistors 56.

In the IO circuit area 50<3>, the interconnect 53a is coupled to the VCCQ pad 51<1>. Each of the circuit units within the output circuit 10b<3> is coupled to the interconnect 53a coupled to the VCCQ pad 51<1>, with the interconnect 53b and the transistor 56 intervening between each of the circuit units and the interconnect 53a.

In the IO circuit area 50<3>, the interconnect 54a is coupled to the VSS pad 52<2>. Each of the circuit units within the output circuit 10b<3> is coupled to the interconnect 54a coupled to the interconnect 54a coupled to the VSS pad 52<2>, with the interconnect 54b and the transistor 55 intervening between each of the circuit units and the interconnect 54a.

6.2 Configuration of Output Circuit 10b

Figure 17:
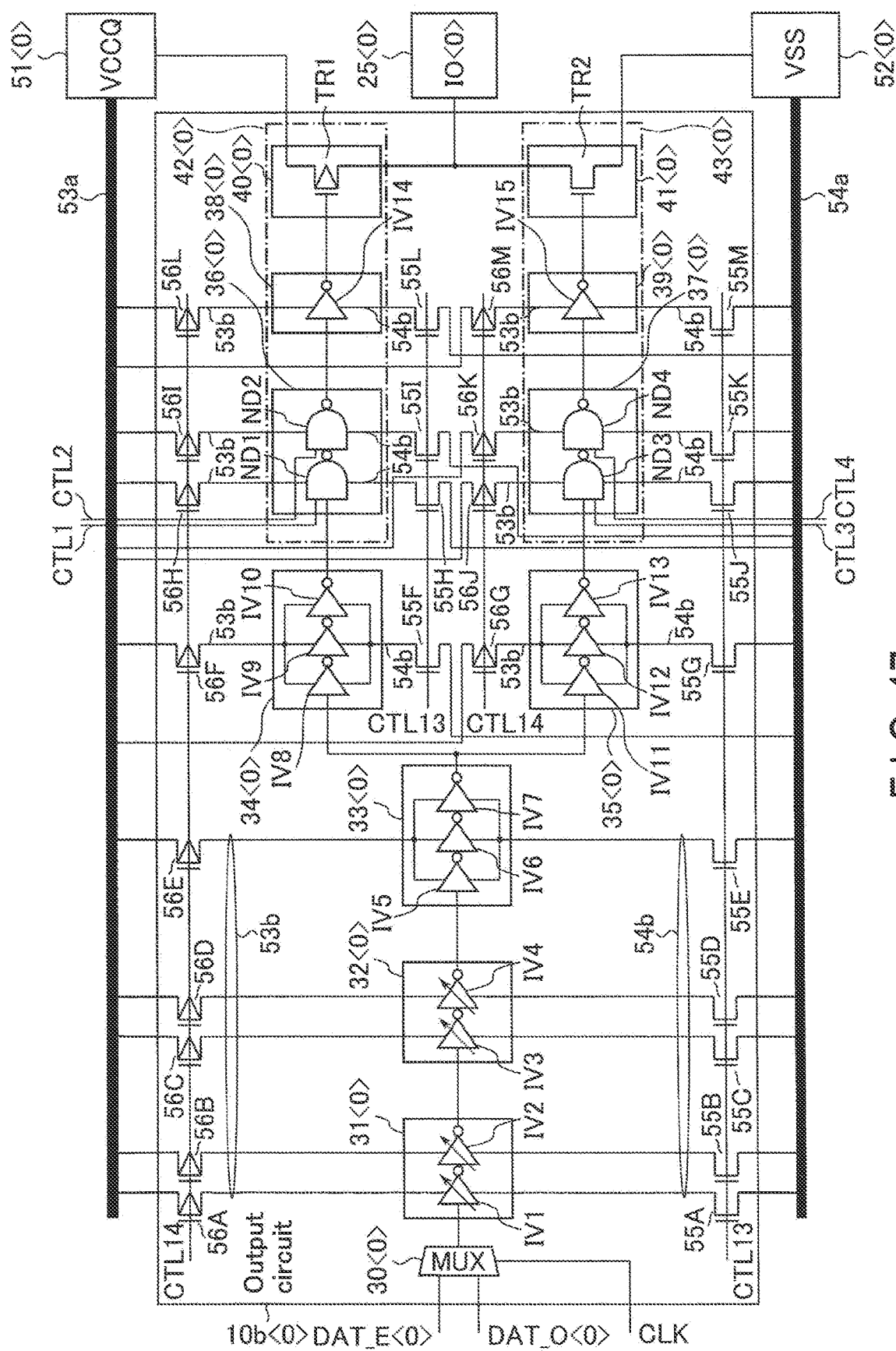
FIG. 17 is a circuit diagram showing one example of an output circuit included in the semiconductor memory device according to the sixth embodiment.

Next, a circuit configuration of the output circuit 10b included in the NAND flash memory 100 according to the present embodiment will be described with reference to FIG. 17. FIG. 17 is a circuit diagram showing one example of the output circuit 10b included in the NAND flash memory 100 according to the present embodiment. Since the output circuits 10b<0> to 10b<7> have the same configuration, details of respective circuit units within the output circuit 10b<0> will be described hereinafter.

In the present embodiment, the plurality of transistors 55 and the plurality of transistors 56 are provided in such a manner that one or more transistors 55 and one or more transistors 56 are provided for each of the adjustment circuit 31<0>, the adjustment circuit 32<0>, . . . , the driver 38<0>, and the driver 39<0>, in particular, one transistor 55 and one transistor 56 are provided for each odd-numbered inverter and each odd-numbered NAND circuit.

As shown in FIG. 17, power supply voltage input terminals of the inverters IV1 and IV2 are coupled independently of each other to the interconnect 53a coupled to the VCCQ pad 51<0>, with the different interconnects 53b and transistors 56 (56A and 56B) respectively intervening between the power supply voltage input terminals and the interconnect 53a.

Ground voltage input terminals of the inverters IV1 and IV2 are coupled independently of each other to the interconnect 54a coupled to the VSS pad 52<0>, with the different interconnects 54b and transistors 55 (55A and 55B) respectively intervening between the ground voltage input terminals and the interconnect 54a.

Power supply voltage input terminals of the inverters IV3 and IV4 are coupled independently of each other to the interconnect 53a coupled to the VCCQ pad 51<0>, with the different interconnects 53b and transistors 56 (56C and 56D) respectively intervening between the power supply voltage input terminals and the interconnect 53a.

Ground voltage input terminals of the inverters IV3 and IV4 are coupled independently of each other to the interconnect 54a coupled to the VSS pad 52<0>, with the different interconnects 54b and transistors 55 (55C and 55D) respectively intervening between the ground voltage input terminals and the interconnect 54a.

Power supply voltage input terminals of the inverters IV5 to IV7 are coupled to the interconnect 53a coupled to the VCCQ pad 51<0>, with the interconnect 53b and the transistor 56E intervening between the power supply voltage input terminals and the interconnect 53a.

Ground voltage input terminals of the inverters IV5 to IV7 are coupled to the interconnect 54a coupled to the VSS pad 52<0>, with the interconnect 54b and the transistor 55E intervening between the ground voltage input terminals and the interconnect 54a.

Power supply voltage input terminals of the inverters IV8 to IV10 are coupled to the interconnect 53a coupled to the VCCQ pad 51<0>, with the interconnect 53b and the transistor 56F intervening between the power supply voltage input terminals and the interconnect 53a.

Ground voltage input terminals of the inverters IV8 to IV10 are coupled to the interconnect 54a coupled to the VSS pad 52<0>, with the interconnect 54b and the transistor 55F intervening between the ground voltage input terminals and the interconnect 54a.

Power supply voltage input terminals of the inverters IV11 to IV13 are coupled to the interconnect 53a coupled to the VCCQ pad 51<0>, with the interconnect 53b and the transistor 56G intervening between the power supply voltage input terminals and the interconnect 53a.

Ground voltage input terminals of the inverters IV11 to IV13 are coupled to the interconnect 54a coupled to the VSS pad 52<0>, with the interconnect 54b and the transistor 55G intervening between the ground voltage input terminals and the interconnect 54a.

Power supply voltage input terminals of the NAND circuits ND1 and ND2 are coupled independently of each other to the interconnect 53a coupled to the VCCQ pad 51<0>, with the different interconnects 53b and transistors 56 (56H and 56I) respectively intervening between the power supply voltage input terminals and the interconnect 53a.

Ground voltage input terminals of the NAND circuits ND1 and ND2 are coupled independently of each other to the interconnect 54a coupled to the VSS pad 52<0>, with the different interconnects 54b and transistors 55 (55H and 55I) respectively intervening between the ground voltage input terminals and the interconnect 54a.

Power supply voltage input terminals of the NAND circuits ND3 and ND4 are coupled independently of each other to the interconnect 53a coupled to the VCCQ pad 51<0>, with the different interconnects 53b and transistors 56 (56J and 56K) respectively intervening between the power supply voltage input terminals and the interconnect 53a.

Ground voltage input terminals of the NAND circuits ND3 and ND4 are coupled independently of each other to the interconnect 54a coupled to the VSS pad 52<0>, with the different interconnects 54b and transistors 55 (55J and 55K) respectively intervening between the ground voltage input terminals and the interconnect 54a.

A power supply voltage input terminal of the inverter IV14 is coupled to the interconnect 53a coupled to the VCCQ pad 51<0>, with the interconnect 53b and the transistor 56L intervening between the power supply voltage input terminal and the interconnect 53a. A ground voltage input terminal of the inverter IV14 is coupled to the interconnect 54a coupled to the VSS pad 52<0>, with the interconnect 54b and the transistor 55L intervening between the ground voltage input terminal and the interconnect 54a.

A power supply voltage input terminal of the inverter IV15 is coupled to the interconnect 53a coupled to the VCCQ pad 51<0>, with the interconnect 53b and the transistor 56M intervening between the power supply voltage input terminal and the interconnect 53a. A ground voltage input terminal of the inverter IV15 is coupled to the interconnect 54a coupled to the VSS pad 52<0>, with the interconnect 54b and the transistor 55M intervening between the ground voltage input terminal and the interconnect 54a.

6.3 Advantageous Effects

With the configuration according to the present embodiment, the respective circuit units are coupled independently of each other to the interconnect 53a coupled to the VCCQ pad 51, with the different interconnects 53b and transistors 56 respectively intervening between the circuit units and the interconnect 53a, and are coupled independently of each other to the interconnect 54a coupled to the VSS pad 52, with the different interconnects 54b and transistors 55 respectively intervening between the circuit units and the interconnect 54a. Therefore, when the transistors 55 and 56 are turned on, as with the third embodiment, the respective circuit units can prevent an increase in voltage drop and fluctuations in ground voltage, thereby being able to prevent a delay in circuit operation. This can prevent a deviation in timing of outputting a signal in output circuits 10b, thereby achieving an improvement in operation reliability.

Furthermore, the configuration according to the present embodiment can reduce a leakage current flowing through the respective circuit units when the transistors 55 and 56 are turned off.

7. Modifications, Etc.

As stated above, the semiconductor memory device according to an embodiment includes: a first circuit unit (for example, 31) to which a first voltage (VCCQ) and a second voltage (VSS) different from the first voltage are applied, and which is configured to receive a first signal, and output a second signal predicated on the first signal; a second circuit unit (for example, 32) to which the first voltage and the second voltage are applied, and which is configured to receive the second signal, and output a third signal predicated on the second signal; a driver circuit (OCD 40) configured to receive a fourth signal predicated on the third signal and output a fifth signal predicated on the fourth signal; an input/output pad (IO pad 25) configured to externally output the fifth signal; a first power supply pad (VCCQ pad 51) to which the first voltage is supplied from the outside; a second power supply pad (VSS pad 52) to which a second voltage is supplied from the outside; a first interconnect (53) configured to provide coupling between the first circuit unit and the first power supply pad; and a second interconnect (53) configured to provide coupling between the second circuit unit and the first power supply pad and have no electrical coupling to the first interconnect.

The embodiments are not limited to the above-described embodiments, and various modifications can be made.

In the output circuit 10b, the circuit units between the MUX 30 and the OCDs 40 and 41 are not limited to the adjustment circuit 31, the adjustment circuit 32, and the drivers 33 to 39. The number of circuit units between the MUX 30 and the OCDs 40 and 41 is not limited to nine.

In the adjustment circuit 31 and the adjustment circuit 32, the number of inverters is not limited to two. In the drivers 33 to 35, the number of inverters is not limited to three. In the drivers 36 and 37, the number of NAND circuits is not limited to two. In the drivers 38 and 39, the number of inverters is not limited to two.

In the output circuit 10b, the plurality of transistors 55 and the plurality of transistors 56 may be provided in such a manner that one transistor 55 and one transistor 56 are provided for each even-numbered inverter and each even-numbered NAND circuit.

Moreover, in the above-described embodiment, a NAND flash memory was described as an example of a semiconductor memory device; however, the embodiment is not limited to a NAND flash memory, and is applicable to other semiconductor memories in general. Furthermore, the present embodiment is applicable to various memory devices other than a semiconductor memory.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A semiconductor memory device comprising:
a memory cell array including a memory cell configured to store data;
a sense amplifier connected to the memory cell;
a data register connected to the sense amplifier;
an input/output circuit connected to the data register; and
a pad group connected to the input/output circuit, wherein
the pad group includes
- a first power supply pad to which a first voltage is supplied;
- a second power supply pad to which a second voltage different from the first voltage is supplied; and
- a first input/output pad, and the input/output circuit includes
- a first circuit unit supplied with the first voltage and the second voltage, and configured to receive a first signal from the data register and output a second signal predicated on the first signal;
- a second circuit unit supplied with the first voltage and the second voltage, and configured to receive the second signal and output a third signal predicated on the second signal;
- a first driver circuit configured to receive a fourth signal predicated on the third signal and output a fifth signal predicated on the fourth signal toward the first input/output pad;
- a first interconnect connected between the first circuit unit and the first power supply pad; and
- a second interconnect connected between the second circuit unit and the first power supply pad, the second interconnect being physically separated from the first interconnect.

2. The device according to claim 1, wherein
the first voltage is higher than the second voltage, and the second voltage is a ground voltage.

3. The device according to claim 1, further comprising:
a third interconnect connected between the first circuit unit and the second power supply pad; and
a fourth interconnect connected between the second circuit unit and the second power supply pad, the fourth interconnect being physically separated from the third interconnect.

4. The device according to claim 3, wherein
the pad group further includes
- a third power supply pad to which the second voltage is supplied; and
- a second input/output pad, and the input/output circuit further includes
- a third circuit unit supplied with the first voltage and the second voltage, and configured to receive a sixth signal from the data register and output a seventh signal predicated on the sixth signal;
- a fourth circuit unit supplied with the first voltage and the second voltage, and configured to receive the seventh signal and output an eighth signal predicated on the seventh signal;
- a second driver circuit configured to receive a ninth signal predicated on the eighth signal and output a tenth signal predicated on the ninth signal toward the second input/output pad;
- a fifth interconnect connected between the third circuit unit and the first power supply pad;
- a sixth interconnect connected between the fourth circuit unit and the first power supply pad, the sixth interconnect being physically separated from the fifth interconnect;
- a seventh interconnect connected between the third circuit unit and the third power supply pad; and
- an eighth interconnect connected between the fourth circuit unit and the third power supply pad, the eighth interconnect being physically separated from the seventh interconnect.

5. The device according to claim 1, wherein
the first voltage is supplied to the first power supply pad from outside,
the second voltage is supplied to the second power supply pad from the outside, and
the fifth signal is output from the first input/output pad to the outside.

6. The device according to claim 1, wherein
the input/output circuit further includes
- a first transistor provided on the first interconnect such that the first voltage is supplied from the first power supply pad to the first circuit unit via the first transistor; and
- a second transistor provided on the second interconnect such that the first voltage is supplied from the first power supply pad to the second circuit unit via the second transistor.

7. The device according to claim 6, further comprising:
a third interconnect connected between the first circuit unit and the second power supply pad; and
a fourth interconnect connected between the second circuit unit and the second power supply pad, the fourth interconnect being physically separated from the third interconnect,
wherein
the input/output circuit further includes
- a third transistor provided on the third interconnect such that the second voltage is supplied from the second power supply pad to the first circuit unit via the third transistor; and
- a fourth transistor provided on the fourth interconnect such that the second voltage is supplied from the second power supply pad to the second circuit unit via the fourth transistor.

8. The device according to claim 7, wherein
each of the first transistor and the second transistor is a P type transistor, and
each of the third transistor and the fourth transistor is an N type transistor.

9. The device according to claim 1, wherein
the first circuit unit includes
- a first-first circuit supplied with the first voltage and the second voltage; and
- a first-second circuit connected to the first-first circuit and supplied with the first voltage and the second voltage, the second circuit unit includes
- a second-first circuit supplied with the first voltage and the second voltage; and
- a second-second circuit connected to the second-first circuit and supplied with the first voltage and the second voltage, the first interconnect includes
- a first-first interconnect connected between the first-first circuit and the first power supply pad; and
- a first-second interconnect connected between the first-second circuit and the first power supply pad, the first-second interconnect being physically separated from the first-first interconnect, the second interconnect includes
- a second-first interconnect connected between the second-first circuit and the first power supply pad; and
- a second-second interconnect connected between the second-second circuit and the first power supply pad, the second-second interconnect being physically separated from the second-first interconnect.

10. The device according to claim 9, wherein
the input/output circuit further includes
- a first transistor provided on the first interconnect such that the first voltage is supplied from the first power supply pad to the first circuit unit via the first transistor; and
- a second transistor provided on the second interconnect such that the first voltage is supplied from the first power supply pad to the second circuit unit via the second transistor, the first transistor includes
- a first-first transistor provided on the first-first interconnect such that the first voltage is supplied from the first power supply pad to the first-first circuit via the first-first transistor; and
- a first-second transistor provided on the first-second interconnect such that the first voltage is supplied from the first power supply pad to the first-second circuit via the first-second transistor, and the second transistor includes
- a second-first transistor provided on the second-first interconnect such that the first voltage is supplied from the first power supply pad to the second-first circuit via the second-first transistor; and
- a second-second transistor provided on the second-second interconnect such that the first voltage is supplied from the first power supply pad to the second-second circuit via the second-second transistor.

11. The device according to claim 10, wherein
the first voltage is higher than the second voltage, and the second voltage is a ground voltage.

12. The device according to claim 1, wherein
in a read operation, the sense amplifier reads data stored in the memory cell of the memory cell array, and transmits the read data to the data register, and
the first signal is predicated on the read data.

* * * * *